United States Patent
Horibe et al.

(10) Patent No.: US 7,368,823 B1
(45) Date of Patent: May 6, 2008

(54) SEMICONDUCTOR DEVICE AND METHOD OF MANUFACTURING THE SAME

(75) Inventors: Masahiro Horibe, Tsukuba (JP); Akio Kawabata, Kawasaki (JP); Mizuhisa Nihei, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 46 days.

(21) Appl. No.: 11/478,630

(22) Filed: Jul. 3, 2006

Related U.S. Application Data

(62) Division of application No. 10/972,770, filed on Oct. 26, 2004, now Pat. No. 7,094,692.

(30) Foreign Application Priority Data

Mar. 26, 2004  (JP) .............................. 2004-093075

(51) Int. Cl.
*H01L 23/48* (2006.01)
*H01L 23/52* (2006.01)
*H01L 29/40* (2006.01)

(52) U.S. Cl. ................ 257/764; 257/768; 257/914; 257/E21.17; 257/E21.128; 257/E21.321; 257/E51.041

(58) Field of Classification Search .............. 257/764, 257/757, 758, 761, 762, 763, 765, 766, 768, 257/770, 771, 914
See application file for complete search history.

(56) References Cited

U.S. PATENT DOCUMENTS 6,062,931 A    5/2000  Chuang et al.
6,440,761 B1 * 8/2002  Choi ........................... 438/20
6,445,006 B1 * 9/2002  Brandes et al. ............... 257/76
6,514,113 B1   2/2003  Lee et al.
6,515,339 B2   2/2003  Shin et al.
6,528,020 B1   3/2003  Dai et al.
6,764,874 B1   7/2004  Zhang et al.
7,094,692 B2 * 8/2006  Horibe et al. ............... 438/680

FOREIGN PATENT DOCUMENTS

JP    2001-032071 A    2/2001
JP    2002-115070 A    4/2002

* cited by examiner

*Primary Examiner*—David Nhu
(74) *Attorney, Agent, or Firm*—Westerman, Hattori, Daniels & Adrian, LLP.

(57) ABSTRACT

A method of manufacturing a semiconductor device having an interconnection part formed of multiple carbon nanotubes is disclosed. The method includes the steps of (a) forming a growth mode control layer controlling the growth mode of the carbon nanotubes, (b) forming a catalyst layer on the growth mode control layer, and (c) causing the carbon nanotubes to grow by heating the catalyst layer by thermal CVD so that the carbon nanotubes serve as the interconnection part. The growth mode control layer is formed by sputtering or vacuum deposition in an atmospheric gas, using a metal selected from a group of Ti, Mo, V, Nb, and W. The growth mode is controlled in accordance with a predetermined concentration of oxygen gas of the atmospheric gas.

4 Claims, 15 Drawing Sheets

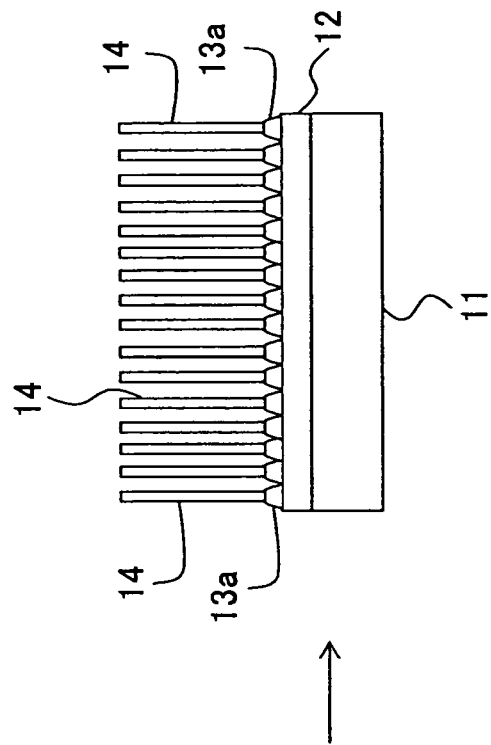
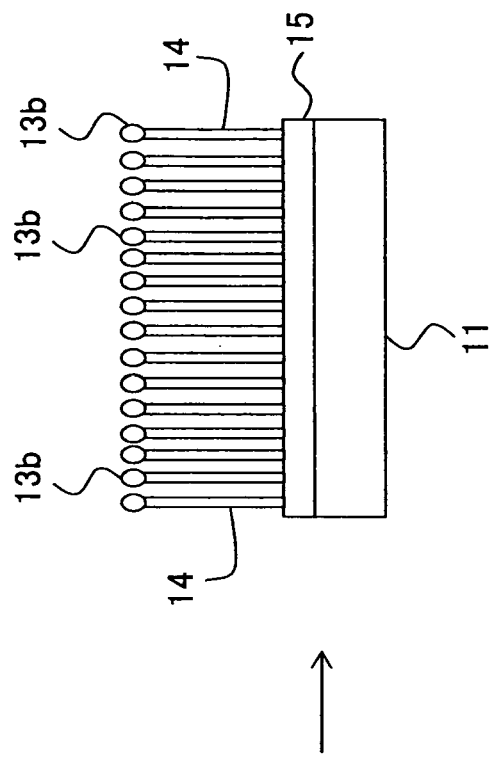
FIG.1A
FIG.1B

FIG.2A
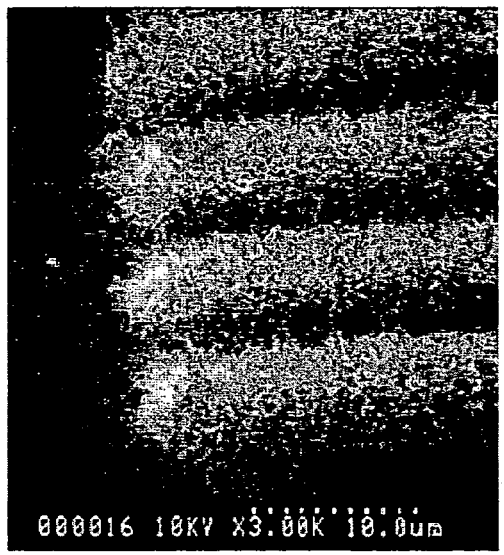
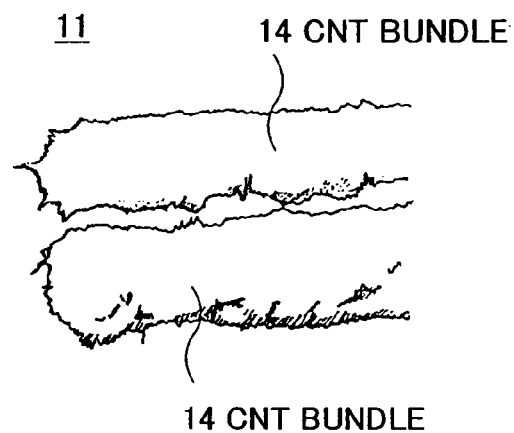
FIG.2B
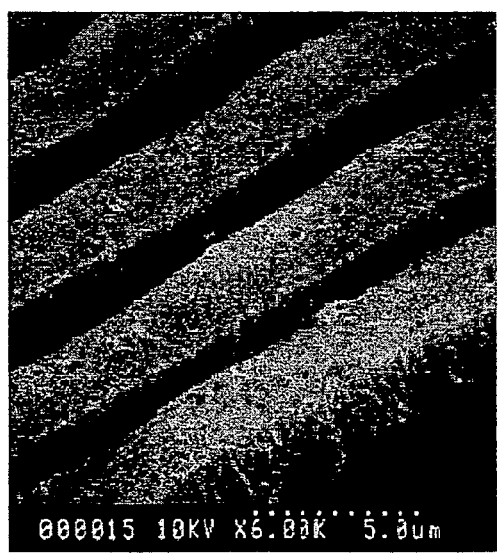
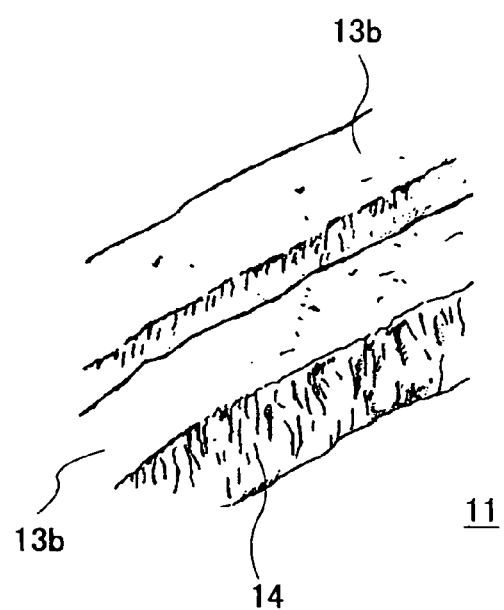

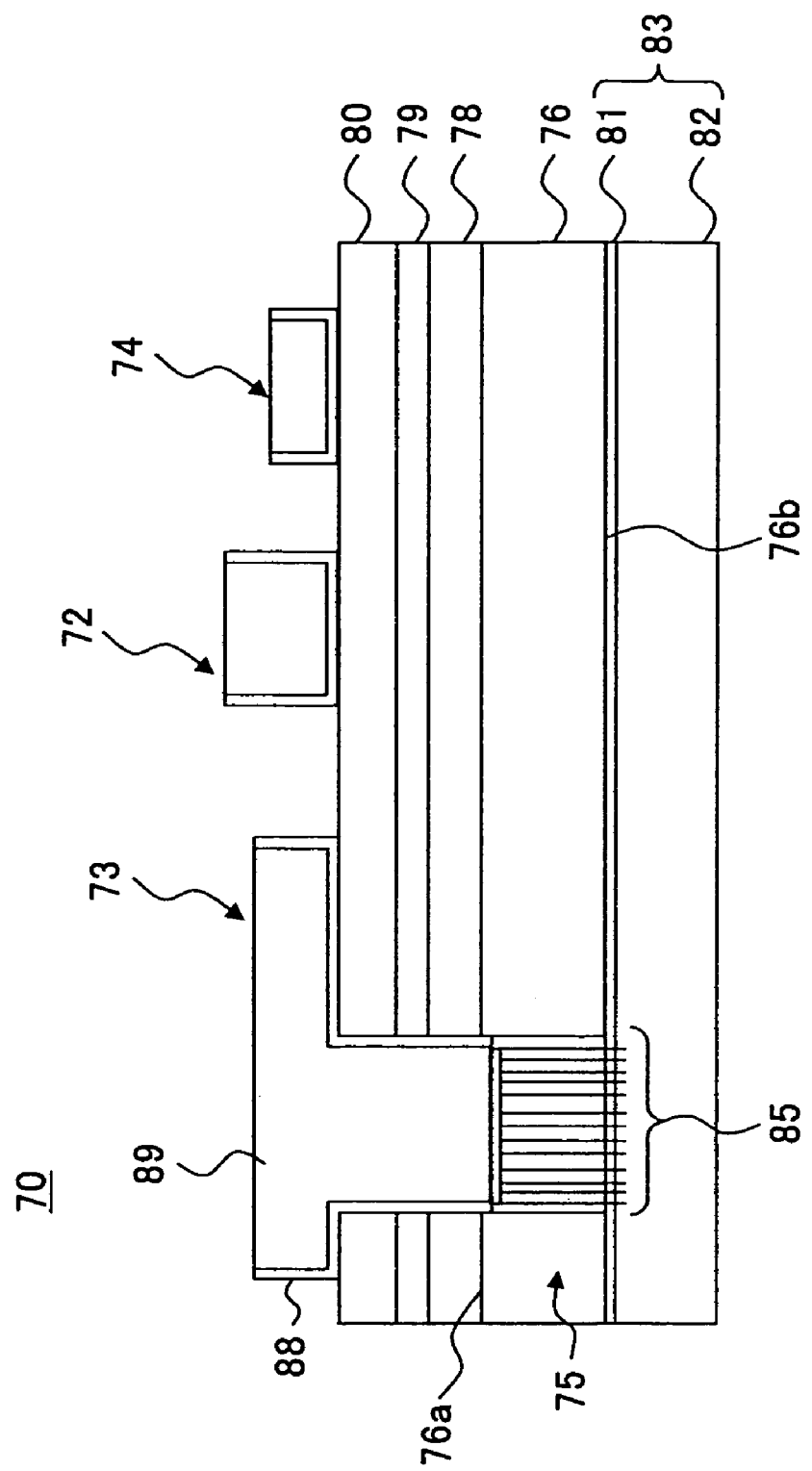

SEMICONDUCTOR DEVICE AND METHOD OF MANUFACTURING THE SAME

This application is a divisional of application Ser. No. 10/972,770, filed in Oct. 26, 2004. U.S. Pat. No. 7,094,692.

CROSS-REFERENCE TO RELATED APPLICATION

The present application is based on Japanese Priority Patent Application No. 2004-093075, filed on Mar. 26, 2004, the entire contents of which are hereby incorporated by reference.

BACKGROUND OF THE INVENTION

1. Field of the Invention

The present invention relates generally to semiconductor devices and methods of manufacturing the same, and more particularly to a semiconductor device including carbon nanotubes in an interconnection layer and through electrodes and a method of manufacturing such a semiconductor device.

2. Description of the Related Art

Application of carbon nanotubes to the interconnects of a large scale integrated circuit (LSI) is taken as an example of their application to electronics. Carbon nanotubes range from a few to tens of nm in diameter, and are as long as a few nanometers in length. Because of its one-dimensional electronic properties due to this shape anisotropy, the carbon nanotube characteristically has a maximum current density allowing the flowing of current without disconnection of 1,000,000 A per square centimeter, which is 100 times or more as high as that of a copper interconnect. Further, with respect to heat conduction, the carbon nanotube is ten times as high in conductivity as copper. In terms of electric resistance, it has been reported that transportation without scattering due to impurities or lattice vibration (phonon), or so-called "ballistic electron transportation," can be realized with respect to electrons flowing through the carbon nanotube. It is known that resistance per carbon nanotube in this case is approximately 6.45 kΩ. The carbon nanotube ranges widely from 0.4 to 100 nm in diameter, and its diameter is formed in a self-organizing manner. Therefore, the carbon nanotube is characterized by an extremely limited fluctuation along its length. Because of these characteristics, a highly reliable, extremely fine metal interconnect with less migration, which is a failure mode due to high current densities, is expected to be realized in the case of applying the carbon nanotube to an LSI interconnect.

Well-known methods of growing a carbon nanotube include arc discharge, laser ablation (laser vaporization), chemical vapor deposition (CVD), and SiC sublimation. According to these methods, transition metal is known to be employed as catalyst metal in forming a carbon nanotube. According to CVD and SiC sublimation, a catalyst metal layer is formed, and patterning is performed on the catalyst metal layer using lithography or etching employed in semiconductor LSI. Thereby, the position of growth of the carbon nanotube can be controlled.

The carbon nanotube is known to grow with a catalyst metal being fixed to its root or tip. The former case is referred to as a so-called root-growth mode, and the latter case is referred to as a tip-growth mode.

In the case of selectively forming carbon nanotubes, a process of patterning a catalyst metal layer is additionally required, which is a disadvantage in terms of the production cost and the reliability of a semiconductor device. The remaining of catalyst metal such as Fe or Co may be a problem in some semiconductor devices.

Accordingly, Japanese Laid-Open Patent Applications No. 2001-32071 and No. 2002-115070 propose generation methods according to which a metal layer of Ti or Ni or a layer of a nitride of such metal is provided under a catalyst metal layer, and carbon nanotubes are grown on the catalyst metal layer in a region where the metal layer or the metal nitride layer is formed.

However, according to such methods, the growth mode of the carbon nanotube cannot be controlled sufficiently. This results in a problem in that the above-described electric characteristics of the carbon nanotube cannot be fully realized in the case of employing carbon nanotubes as interconnect material in the interconnection part and the vertical interconnection part of a semiconductor device. Further, if complete removal of catalyst metal is required, there is a problem in that the catalyst layer remains at the root of any carbon nanotube grown in a root-growth mode, thus resulting in insufficient removal of the catalyst metal.

Further, in the case of employing the carbon nanotube in a vertical interconnection part, such as a via, of a semiconductor device, the catalyst metal layer and Al or Cu used in an interconnection part connected to the vertical interconnection part are subject to interdiffusion, thus resulting in the problem of a decline in the catalytic function. Further, when an interlayer insulating film is formed on the catalyst metal layer, a plasma or ions collide or come into contact with the surface of the catalyst metal layer, thus causing physical damage thereto. This also results in the problem of a decline in the catalytic function.

SUMMARY OF THE INVENTION

Accordingly, it is a general object of the present invention to provide a semiconductor device and a method of manufacturing the same in which the above-described disadvantages are eliminated.

A more specific object of the present invention is to provide a semiconductor device and a method of manufacturing the same in which an interconnection part composed of carbon nanotubes is formed by controlling the growth mode of the carbon nanotube.

Another more specific object of the present invention is to provide a semiconductor device and a method of manufacturing the same in which carbon nanotubes are selectively formed into an interconnection part while the growth mode thereof is controlled.

The above objects of the present invention are achieved by a method of manufacturing a semiconductor device having an interconnection part formed of a plurality of carbon nanotubes, the method including the steps of: (a) forming a growth mode control layer controlling a growth mode of the carbon nanotubes; (b) forming a catalyst layer on the growth mode control layer; and (c) causing the carbon nanotubes to grow by heating the catalyst layer by thermal CVD so that the carbon nanotubes serve as the interconnection part, wherein the growth mode control layer is formed by one of sputtering and vacuum deposition in an atmospheric gas, using a metal selected from a group of Ti, Mo, V, Nb, and W; and the growth mode is controlled in accordance with a predetermined concentration of oxygen gas of the atmospheric gas.

The above objects of the present invention are also achieved by a semiconductor device including a vertical interconnection part formed of a plurality of carbon nanotubes, including: a growth mode control layer formed of one of a metal and a metal oxide thereof, the metal being selected from a group of Ti, Mo, V, Nb, and W, the metal oxide having an oxygen concentration of less than 1 at. %; a catalyst layer formed on the growth mode control layer; the carbon nanotubes formed in a region of the vertical connection part on the catalyst layer, the carbon nanotubes extending in a vertical direction; and an alloy layer of the growth mode control layer and the catalyst layer, the alloy layer being formed in a region other than the region of the vertical interconnection part.

The above objects of the present invention are also achieved by a semiconductor device including a vertical interconnection part formed of a plurality of carbon nanotubes, including: a growth mode control layer formed of one of a metal and a metal oxide thereof, the metal being selected from a group of Ti, Mo, V, Nb, and W; a catalyst layer of Ni formed on the growth mode control layer; a protection film formed in a region other than a region of the vertical interconnection part on the catalyst layer; and the carbon nanotubes formed in the region of the vertical interconnection part, the carbon nanotubes extending in a vertical direction.

The above objects of the present invention are also achieved by a semiconductor device including an interconnection part formed of one of Cu and Al and a vertical interconnection part that is in contact with a surface of the interconnection part, wherein: the vertical interconnection part includes: a growth mode control layer formed on the interconnection part, the growth mode control layer being formed of one of a metal selected from a group of Mo, V, Nb, and W, a metal oxide of the metal, and a metal oxide of Ti; a catalyst layer formed on the growth mode control layer; and a plurality of carbon nanotubes formed on the catalyst layer.

The above objects of the present invention are also achieved by a method of manufacturing a semiconductor device having a carbon nanotube structure in a through hole of a substrate, the method including the steps of: (a) selectively forming the carbon nanotube structure on a process substrate; (b) forming a metal film on a surface of the carbon nanotube structure; (c) forming an electrode covering the through hole on one of opposing surfaces of the substrate; and (d) inserting the carbon nanotube structure into the through hole from a side of another one of the opposing surfaces of the substrate, and adhering the carbon nanotube structure to the electrode by heating the electrode and the metal film.

The above objects of the present invention are also achieved by a method of manufacturing a semiconductor device having an interconnection part formed of a plurality of carbon nanotubes and a conductive material, the method including the steps of: (a) forming a growth mode control layer of one of a metal and a metal oxide thereof, the metal being selected from a group of Ti, Mo, V, Nb, and W; (b) forming a catalyst layer covering the growth mode control layer; (c) causing the carbon nanotubes to grow by heating the catalyst layer by thermal CVD so that the carbon nanotubes serve as the interconnection part; and (d) filling the interconnection part with the conductive material.

The above objects of the present invention are also achieved by a method of manufacturing a semiconductor device having an interconnection part formed of a plurality of carbon nanotubes and a conductive material, the method including the steps of: (a) forming a plurality of conductive projections in a region where the interconnection part is to be formed; (b) forming a growth mode control layer covering the conductive projections, the growth mode control layer being formed of one of a metal and a metal oxide thereof, the metal being selected from a group of Ti, Mo, V, Nb, and W; (c) forming a catalyst layer covering the growth mode control layer; (d) causing the carbon nanotubes to grow by heating the catalyst layer by thermal CVD and applying an electric field in a direction from one to another between the conductive projections so that the carbon nanotubes serve as the interconnection part; and (e) filling the interconnection part with the conductive material.

According to the present invention, the growth mode of carbon nanotubes by thermal CVD can be controlled by using a growth mode control layer formed of a metal selected from a group of Ti, Mo, V, Nb, and W or a metal oxide of the metal under a catalyst layer and setting the oxygen concentration of an atmospheric gas at the time of forming the growth mode control layer to a predetermined value.

BRIEF DESCRIPTION OF THE DRAWINGS

Other objects, features and advantages of the present invention will become more apparent from the following detailed description when read in conjunction with the accompanying drawings, in which:

FIGS. 1A and 1B are schematic sectional views for illustrating the principles of the present invention;

FIGS. 2A and 2B show SEM photographs of carbon nanotubes and their schematic diagrams;

FIG. 12 is a sectional view of the semiconductor device taken along the line A-A of FIG. 11 according to the fourth embodiment of the present invention;

DETAILED DESCRIPTION OF THE PREFERRED EMBODIMENTS

Figure 3:
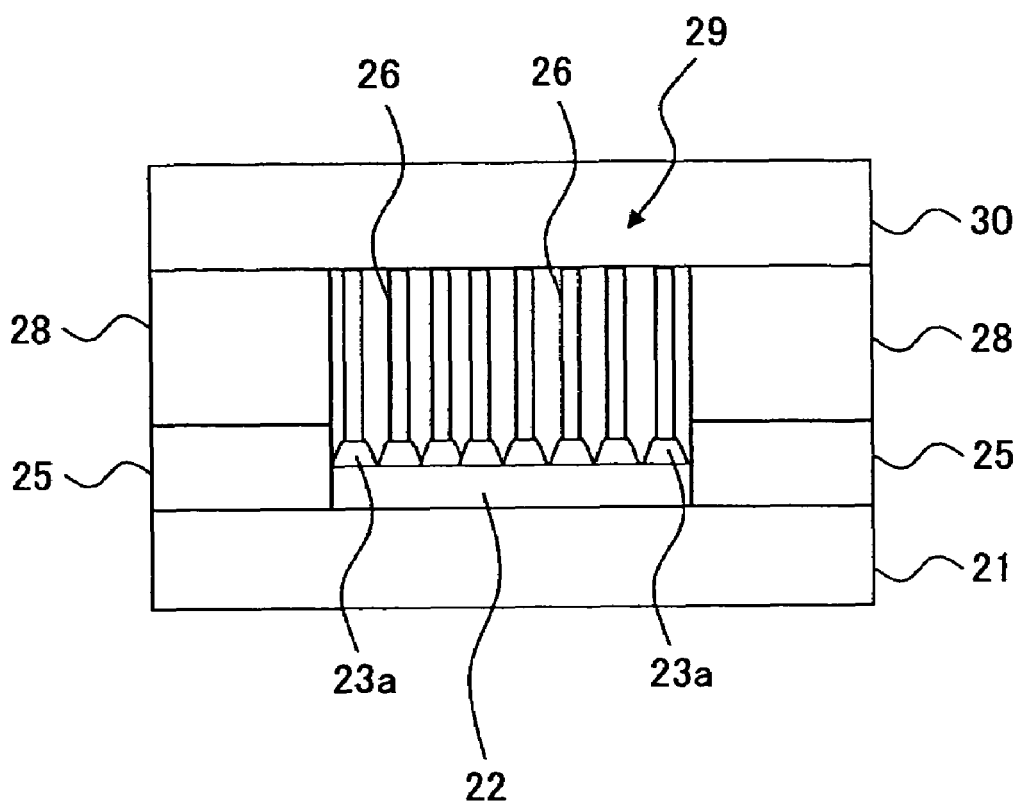
FIG. 3 is a sectional view of part of a semiconductor device according to a first embodiment of the present invention.

First, a description is given of the principles of the present invention.

FIGS. 1A and 1B are schematic sectional views for illustrating the principles of the present invention. In the drawings, carbon nanotubes and other elements are shown enlarged for convenience of description.

Referring to FIG. 1A, a growth mode control layer 12 and a catalyst layer 13 are successively formed on a substrate 11. The growth mode control layer 12 is formed of a metal that is one of Mo, V, Nb, W, and Ti. Mo, V, Nb, and W are refractory metals. The catalyst layer 13 is formed of one of Ni, Fe, Co, Pd, and their alloys. As a result of heating to 400-900° C. by thermal CVD and supplying a process gas containing carbon, such as acetylene gas, carbon nanotubes (CNTs) 14 grows from the catalyst layer 13. At this point, the catalyst layer 13 aggregates into a particulate catalyst layer 13a, and the carbon nanotubes 14 grow with the particulate part serving as a nucleus of growth. If the growth mode control layer 12 is formed of any of the above-described refractory metals and Ti, the carbon nanotubes 14 grow in the root-growth mode with the particulate catalyst layer 13a remaining at the roots of the carbon nanotubes 14. The carbon nanotubes 14 formed by the root-growth mode are fixed to the growth mode control layer 12 via the particulate catalyst layer 13a so as to have a high strength of adhesion to the substrate 11.

In the case of forming a growth mode control layer of a metal oxide of any of the above-described refractory metals and Ti in an atmosphere of a less than 0-1 vol % oxygen concentration, the root-growth mode also results. That is, the carbon nanotubes 14 grow in the root-growth mode by setting the oxygen concentration of the metal oxide in the growth mode control layer to less than 1 at. %.

On the other hand, referring to FIG. 1B, when a growth mode control layer 15 is formed of a metal oxide of any of the above-described refractory metals and Ti, the carbon nanotubes 14 grow in the tip-growth mode with catalyst particles 13b being fixed to the tips of the carbon nanotubes 14 by thermal CVD under the same conditions as in the case of FIG. 1A. According to studies by the inventors of the present invention, in the case of forming the growth mode control layer 15 by sputtering or vacuum deposition, an inert gas to which oxygen gas is added is employed as an atmospheric gas with metal material being used as a sputter target. Oxygen concentration (=oxygen volume/(oxygen volume+inert gas volume)×100) is set to 0.1 vol % or higher. The degree of oxidation of the metal oxide of the growth mode control layer is thus determined. The oxygen concentration of the growth mode control layer 15 formed under these conditions is higher than or equal to approximately 1 at. %. The growth mode control layer may be formed by preforming a metal film of any of the above-described refractory metals and Ti, and oxidizing the metal film into a metal oxide film by exposing the metal film to an oxygen plasma or oxygen radicals.

The carbon nanotubes 14 formed by the tip-growth mode are fixed substantially directly to the growth mode control layer 15 with the strength of adhesion to the growth mode control layer 15 being lower than that in the case of the root-growth mode. Further, the carbon nanotubes 14 are substantially equal in length with their tips forming a plane.

FIGS. 2A and 2B show SEM photographs of carbon nanotubes and their schematic diagrams. FIG. 2A shows carbon nanotubes formed by the root-growth mode, and FIG. 2B shows carbon nanotubes formed by the tip-growth mode. Each SEM photograph shows that multilayer bodies of a growth mode control layer and a catalyst layer are formed selectively in multiple arrays on a substrate.

Referring to FIG. 2A, the carbon nanotubes 14 (shown like white lines) that are formed in the root-growth mode by the configuration shown in FIG. 1A grow radially. Although not shown in detail in the SEM photograph, the carbon nanotubes 14 vary in length more greatly than in the case of the tip-growth mode.

On the other hand, referring to FIG. 2B, the catalyst particles 13b on the tips of the carbon nanotubes 14 formed in the tip-growth mode by the configuration shown in FIG. 1B form a plane substantially parallel to the surface of the substrate 11. That is, the carbon nanotubes 14 are substantially equal in length.

Thus, the carbon nanotubes 14 formed by the tip-growth mode are substantially equal in length with their tips forming a plane, and their strength of adhesion to the growth mode control layer 15 is lower than that in the root-growth mode. Accordingly, the carbon nanotubes 14 may be adhered to another member using a conductive adhesive agent and removed so that a carbon nanotube bundle may be easily introduced into the member. For instance, a bundle of carbon nanotubes 14 may be embedded into a via hole of a semiconductor device or a through hole of the substrate 11 so as to be employed as a via, a through electrode, or an electron emission element of a field emission display.

As described above, by controlling the oxygen concentration of the metal or metal oxide of the growth mode control layer 12 or 15 formed as the undercoat layer of the catalyst layer 13, the growth mode of the carbon nanotubes 14 can be controlled, and the carbon nanotubes 14 can be applied to a semiconductor device in accordance with their growth mode.

A description is given below, with reference to the accompanying drawings, of embodiments of the present invention.

First Embodiment

In this embodiment, a semiconductor device having contacts formed of quality carbon nanotubes that are selectively formed at low temperature is disclosed.

FIG. 3 is a sectional view of part of a semiconductor device 20 according to the first embodiment of the present invention.

Referring to FIG. 3, the semiconductor device 20 includes a substrate 21 such as a silicon substrate, a contact 29 formed on the substrate 21, an alloy layer 25 and an interlayer insulating layer 28 that are formed in the region other than the contact 29, and an interconnection part 30 that is formed on the interlayer insulating film 28 so as to be in contact with the surface of the contact 29. The Contact 29 is composed of a growth mode control layer 22, a particulate catalyst layer 23a, and carbon nanotubes (CNTs) 26 grown upward from the particulate catalyst layer 23a, which serves as a nucleus of growth. In the semiconductor device 20, an active layer (not graphically represented) formed on the substrate 21 is electrically connected to the interconnection layer 30 on the interlayer insulating film 28 via the contact 29. The contact 29 is composed mainly of the carbon nanotubes 26. Accordingly, the contact 29 has low electric resistance so as to be able to perform high-current-density electric conduction.

The growth mode control layer 22 forming the contact 29 is formed of a metal that is one of Mo, V, Nb, W, and Ti. Mo, V, Nb, and W are refractory metals. Alternatively, the growth mode control layer 22 may also be formed of a metal oxide of any of the above-described metals, the metal oxide having an oxygen concentration of less than 1 at. %. The carbon nanotubes 26 can be formed via the particulate catalyst layer 23a (a catalyst layer) in the root-growth mode by thermal CVD. The carbon nanotubes 26 are fixed to the growth mode control layer 22 via the particulate catalyst layer 23a. This increases the strength of the contact 29 composed of the growth mode control layer 22, the particulate catalyst layer 23a, and the carbon nanotubes 26, thus resulting in an increase in adhesion between the substrate 21 and the contact 29.

The growth mode control layer 22 may also be formed of a metal oxide of any of the above-described refractory metals and Ti, the metal oxide having an oxygen concentration higher than or equal to approximately 1 at. %. In this case, the carbon nanotubes 26 grow in the tip-growth mode, and instead of the particulate catalyst layer 23a, catalyst particles (not graphically represented) are fixed to the tips of the carbon nanotubes 26. The adhesion between the carbon nanotubes 26 and the growth mode control layer 22 is poorer than in the case of the root-growth mode. However, a bundle of the carbon nanotubes 26 substantially uniform in length can be formed, thus facilitating connection to the interconnect part 30.

The film thickness of the growth mode control layer 22 is set to 50 nm or more, preferably, 50-150 nm, and more preferably, 50-100 nm. It is believed that as a result of setting the growth mode control layer 22 to 50 nm or more in film thickness, the alloy layer 25 is formed in a region other than the contact 29 with a decreased catalytic function so as to prevent the growth of the carbon nanotubes 26, which is described below in the description of a semiconductor device manufacturing method. Further, the alloy layer 25 remains but is alloyed. Therefore, the alloy layer 25 can avoid the influence exerted by the catalyst layer 23a itself over a semiconductor device.

The particulate catalyst layer 23a is formed of any of Ni, Fe, Co, Pd, and their alloys. It is preferable that the particulate catalyst layer 23a be disposed evenly on the growth mode control layer 22. The particulate catalyst layer 23a may be replaced by a catalyst layer of a continuous film of the same material. By heating the substrate 21 by thermal CVD, the catalyst layer aggregates into the particulate catalyst layer 23a, so that catalyst particles are formed, thus facilitating the growth of the carbon nanotubes 26.

The carbon nanotubes 26 are approximately 1.5-20 nm in diameter and 3 μm in length. In the drawings, the carbon nanotubes 26 are shown upright. Actually, however, the carbon nanotubes 26 are formed, grown in a vertical direction with lateral curvature to a certain extent.

When the carbon nanotubes 26 are grown in the root-growth mode, the carbon nanotubes 26 adhere strongly to the growth mode control layer 22 via the particulate catalyst layer 23a in the contact 29. As a result, the mechanical strength of the contact 29 is increased. Therefore, even when a mechanical stress or a thermal stress is applied to the contact 29 during a manufacturing process, it is possible to prevent the carbon nanotubes 26 from being removed or disconnected at their roots. Further, according to studies by the inventors of the present invention, when the carbon nanotubes 26 are grown in the root-growth mode, the electric resistance of the contact 29 is one sixth of that in the case of the tip-growth mode, so that it is possible to reduce the electric resistance of the contact 29. Further, the electric resistance of the contact 29 can be reduced compared with that of a conventional contact made of Cu or Al.

Next, a description is given of a manufacturing process according to the first embodiment of the present invention.

FIGS. 4A through 4E are diagrams showing the manufacturing process according to the first embodiment.

Figure 4A:
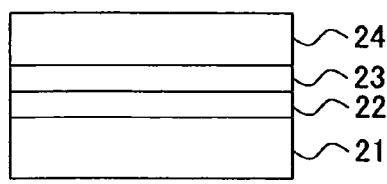
FIGS. 4A through 4E are diagrams showing a semiconductor device manufacturing process according to the first embodiment of the present invention.

First, in the process of FIG. 4A, a natural oxide film on the surface of the substrate 21 is removed, and the growth mode control layer 22 (for instance, 180 nm in film thickness) is formed on the substrate 21 by sputtering or vacuum deposition using one of the above-described refractory metals and Ti. The oxygen concentration of an atmospheric gas is set to less than 0.1 vol %, and the rest is an inert gas such as Ar gas. As described above, the growth mode control layer 22 is set to 50 nm or more (preferably, 50-150 nm, and more preferably, 50-100 nm) in film thickness.

Further, in the process of FIG. 4A, a catalyst layer 23 (for instance, 20 nm in film thickness) of Ni is formed in the inert gas atmosphere. Then, an insulating film 24 of a silicon oxide film having a film thickness of, for instance, 350 nm is formed to cover the catalyst layer 23.

Figure 4D:
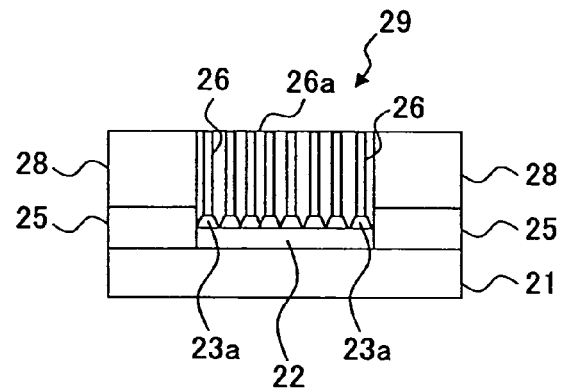
Figure 4B:
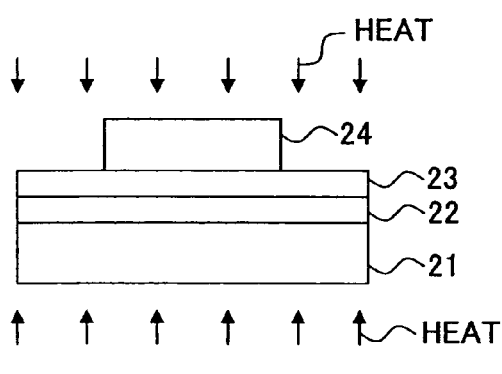

Next, in the process of FIG. 4B, a resist film (not graphically represented) is formed on the insulating film 24. Using photolithography or etching, the insulating film 24 is ground selectively in the region other than where the contact 29 is to be formed in the next process, so that the catalyst layer 23 is exposed in the region.

Further, in the process of FIG. 4B, using thermal CVD, for instance, hot filament CVD, heating is performed from below the substrate 21 and above the insulating film 24, and a hydrocarbon gas such as acetylene or methane serving as a material gas and hydrogen gas serving as a carrier gas are supplied with a pressure being set to 1 kPa, thereby causing the carbon nanotubes 26 to grow. Using heating wire heaters, heating is performed from below the substrate 21 and above the insulating film 24 in a temperature range of 600-700° C. The carbon nanotubes 26 grow only on the catalyst layer 23 under the insulating film 24. The carbon nanotubes 26 do not grow on the catalyst layer 23 where the insulating film 24 is not formed. Specifically, as shown in FIG. 4C, the catalyst layer 23 is converted into the particulate catalyst layer 23a under the insulating film 24, and the carbon nanotubes 26 grow with the particles of the particulate catalyst layer 23a serving as nuclei of growth. In the region where the catalyst layer 23 is exposed (the region other than the contact 29), interdiffusion occurs between the catalyst layer 23 and the growth mode control layer 22 as a result of the direct heating, so that the alloy layer 25 having a reduced catalytic function of the catalyst layer 23 is formed. The carbon nanotubes 26 do not grow in this region.

According to studies by the inventors of the present invention, the carbon nanotubes 26 can be caused to grow on the catalyst layer 23 covered with the insulating film 24 at a heating temperature approximately 100° C. lower than that in the case of growing carbon nanotubes on the catalyst layer 23 that is not covered with the insulating film 24. This is believed to be because the catalytic function of the alloy layer 25 formed as a result of the interdiffusion of the catalyst layer 23 and the growth mode control layer 22, set to be 50 nm or more in thickness, is reduced so as to prevent the interdiffusion of the catalyst layer 23 under the insulating film 24.

By using Co or a Co alloy instead of Ni for the catalyst layer 23, heating temperature at the time of carbon nanotube growth can be further reduced by 50-100° C. Further, using methyl alcohol or ethyl alcohol as the material gas, the heating temperature can be further reduced by 50-100° C.

Oxygen deficiency can be prevented in the case of using a metal oxide of a perovskite structure as a ferroelectric capacitor film as an FeRAM.

In terms of the linearity of the carbon nanotubes 26, it is preferable to apply a vertical electric field to the substrate 21 at the time of the growth of the carbon nanotubes 26.

Next, in the process of FIG. 4D, the interlayer insulating film 28, composed of a silicon oxide film such as a TEOS-based silicon oxide film, PSG (phosphosilicate glass), BSG (borosilicate glass), or a silicon nitride film, is formed by CVD or sputtering so as to cover the structure of FIG. 4C. The interlayer insulating film 28 is flattened by CMP so that a surface 26a of the carbon nanotubes 26 is exposed.

Figure 4E:
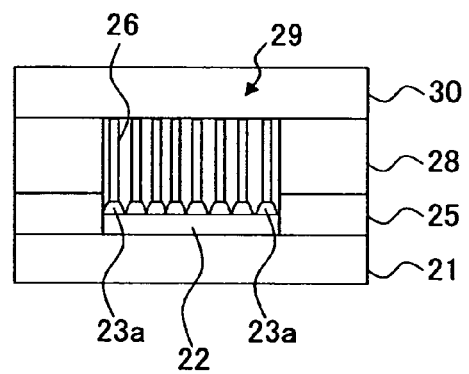
Figure 4C:
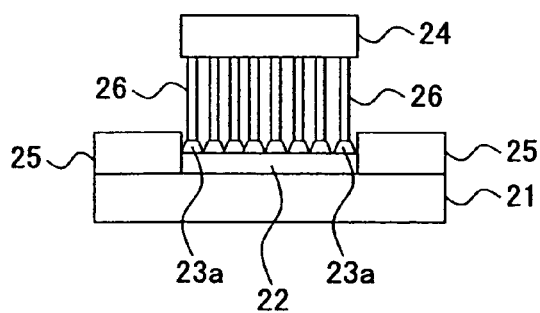

Next, in the process of FIG. 4E, the interconnection part 30 of Cu or Al, having a film thickness of, for instance, 200 nm, is formed on the interlayer insulating film 28 by CVD, plating, or sputtering so as to be in contact with the surface 26a of the carbon nanotubes 26. Although not graphically represented, a barrier metal film such as a TiN film having a film thickness of 10 nm may be preformed on the interconnection part 30. Thereby, a semiconductor device having the contact 29 connecting the active region of the substrate 21 and the interconnection part 30, that is, the semiconductor device 20 of the first embodiment, is completed.

According to the manufacturing method of this embodiment, the growth mode control layer 22 is set to be 50 nm or more in film thickness, and the carbon nanotubes 26 can be formed selectively only under the insulating film 24 without patterning the catalyst layer 23. Further, temperature of heating by thermal CVD can be reduced.

Further, the catalyst layer 23 under the insulating film 24 is prevented from being exposed to etching ions or etching liquid when the interlayer insulating film 28 is patterned. Accordingly, a decrease in the catalytic function of the catalyst layer 23 can be prevented, so that the carbon nanotubes 26 of good quality can be formed.

The contact 29 of this embodiment is applicable to a via between interconnection layers. The alloy layer 25 may be removed by RIE before formation of the interlayer insulating film 28 in the process of FIG. 4D as required.

Figure 5:
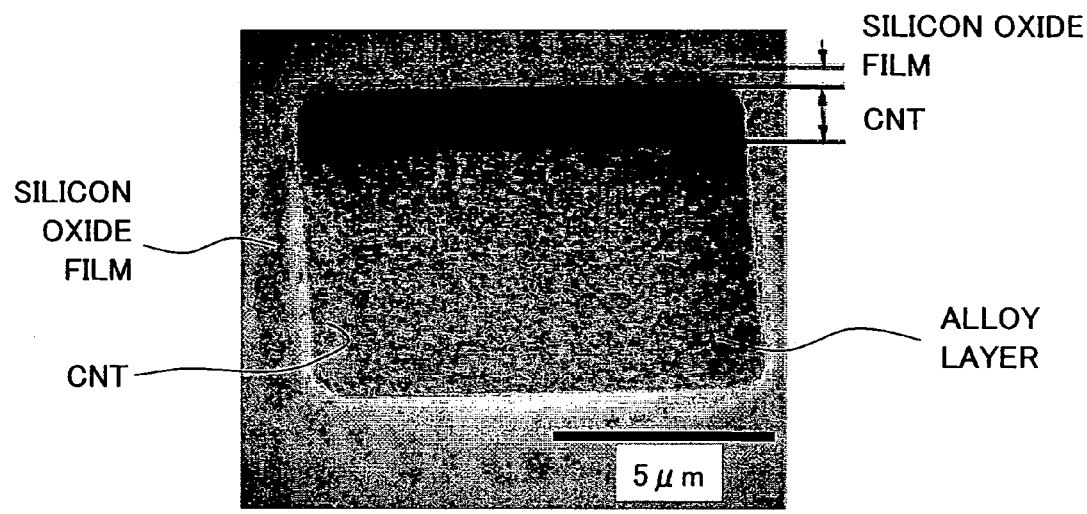
FIG. 5 shows an SEM photograph showing growth of carbon nanotubes according to the first embodiment of the present invention.

FIG. 5 shows an SEM photograph showing growth of carbon nanotubes. A multilayer structure of a silicon substrate, a Ti film, a Ni film, and a silicon oxide film was formed in the configuration of FIG. 4A. An opening was formed in the center of the silicon oxide film by grinding. The carbon nanotubes were formed under the silicon oxide film under the above-described thermal CVD conditions (except for heating temperature, which was 540° C.). The SEM photograph of FIG. 5, which shows this structure, was taken from a direction at an angle to this structure.

Referring to FIG. 5, the carbon nanotubes are formed under the silicon oxide film. No carbon nanotubes are formed in the opening of the silicon oxide film, where the surface of an alloy layer into which the Ti and Ni films have been alloyed is exposed. This shows that it is possible to form carbon nanotubes selectively only under an insulating film as described with reference to FIG. 4C.

Second Embodiment

In this embodiment, a semiconductor device with a contact formed of quality carbon nanotubes of high density is disclosed. According to the second embodiment, a protection film is formed on the surface of a catalyst layer, and the protection film is removed immediately before causing the carbon nanotubes to grow so as to prevent a decline in the catalytic function of the catalyst layer during a manufacturing process.

Figure 6:
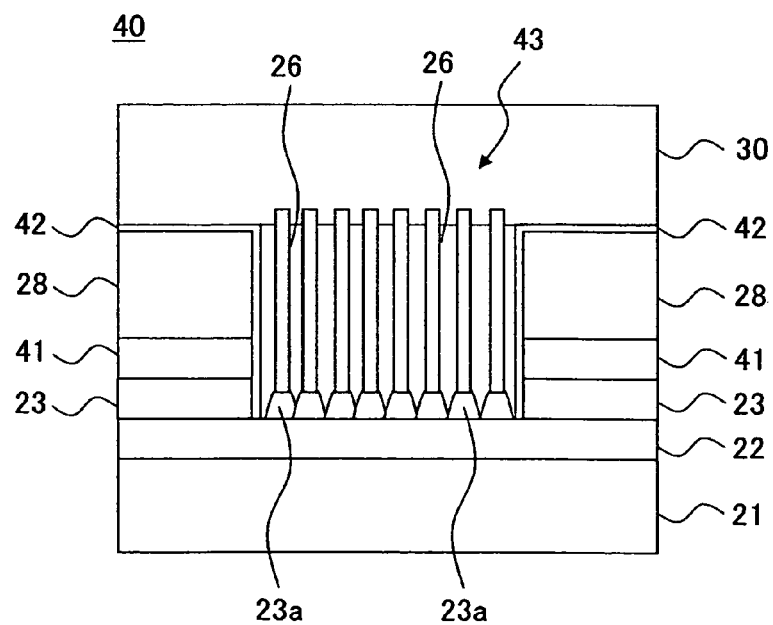
FIG. 6 is a sectional view of part of a semiconductor device according to a second embodiment of the present invention.

FIG. 6 is a sectional view of part of a semiconductor device 40 according to the second embodiment of the present invention. In FIG. 6, the same elements as those described above are referred to by the same numerals, and a description thereof is omitted.

Referring to FIG. 6, the semiconductor device 40 includes the substrate 21 such as a silicon substrate, the growth mode control layer 22 formed on the substrate 21, a contact 43 formed on the growth mode control layer 22, and the interconnection part 30 formed on the contact 43. In the region other than the contact 43, the catalyst layer 23, a protection film 41, and the interlayer insulating film 28 are successively stacked on the growth mode control layer 22. The contact 43 is composed of the particulate catalyst layer 23a and the carbon nanotubes 26 grown upward therefrom with the particulate catalyst layer 23a serving as a nucleus of growth.

In the semiconductor device 40, an active layer (not graphically represented) formed on the substrate 21 is electrically connected to the interconnection layer 30 on the interlayer insulating film 28 via the contact 43. In the contact 43, the roots of the carbon nanotubes 26 are electrically connected to the surface of the substrate 21 via the particulate catalyst layer 23a and the growth mode control layer 22, and a substantial part of the tips of the carbon nanotubes 26 is inside the interconnection part 30. Thus, the contact 43 performs vertical electric conduction.

The protection film 41 is, for instance, 350 nm in film thickness, and is composed of a metal film or a metal oxide film of a metal other than Ni, Au, and Pt, which is soluble in etching liquid including hydrogen fluoride. The protection film 41 prevents damage to the catalyst layer 23 due to heat or particle impact at the time of forming the interlayer insulating film 28, thereby preventing a decline in the catalytic function of the catalyst layer 23.

The tips of the carbon nanotubes 26, forming the contact 43, are inside the interconnection part 30 above. As described below, after forming a contact hole 43h in the interlayer insulating film 28, the carbon nanotubes 26 are formed in the contact hole 43h. Accordingly, by setting the length of the carbon nanotubes 26 to a value greater than the depth of the contact hole 43h, the electric resistance of the contact 43 can be further reduced.

A barrier metal film 42 of a TiN film may be formed on the inner wall of the contact hole 43h. As a result, it is possible to prevent Cu of the interconnection part 30 from diffusing into the interlayer insulating film 28.

Next, a description is given of a semiconductor device manufacturing method according to this embodiment.

FIGS. 7A through 7E are diagrams showing a manufacturing process according to the second embodiment.

Figure 7A:
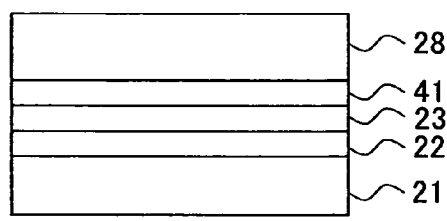
FIGS. 7A through 7E are diagrams showing a semiconductor device manufacturing process according to the second embodiment of the present invention.

First, in the process of FIG. 7A, a natural oxide film on the surface of the substrate 21 is removed, and the growth mode control layer 22 of, for instance, a Ti film, and the catalyst layer 23 of a Ni film are successively formed on the substrate 21 as in the manufacturing method of the first embodiment.

Further, in the process of FIG. 7A, the protection film 41 of a $TiO_2$ film having a film thickness of 2.5 nm is formed by electron beam evaporation so as to cover the catalyst layer 23. Then, the interlayer insulating film 28 of a silicon oxide film is formed to cover the protection film 41.

Figure 7D:
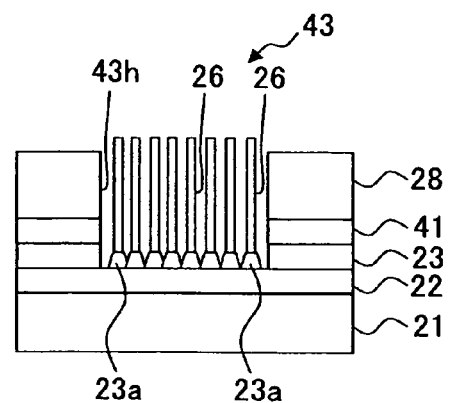
Figure 7B:
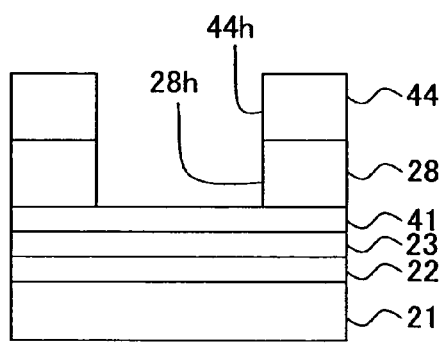

Next, in the process of FIG. 7B, a resist film 44 is formed on the interlayer insulating film 28. The resist film 44 is removed in a region where the contact 43 is to be formed in a downstream process. As a result, an opening 44h exposing the surface of the interlayer insulating film 28 is formed.

Further, in the process of FIG. 7B, using the resist film 44 as a mask, the interlayer insulating film 28 is etched by dry etching such as RIE or ion milling, thereby forming an opening 28h exposing the surface of the protection film 41. Wet etching may be employed instead of dry etching.

Figure 7E:
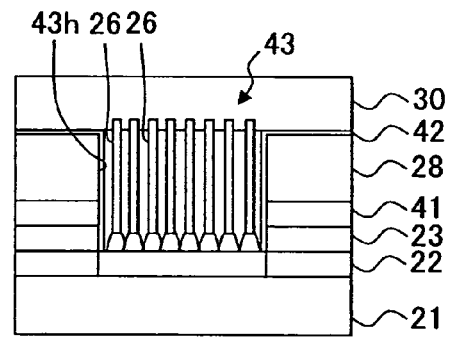
Figure 7C:
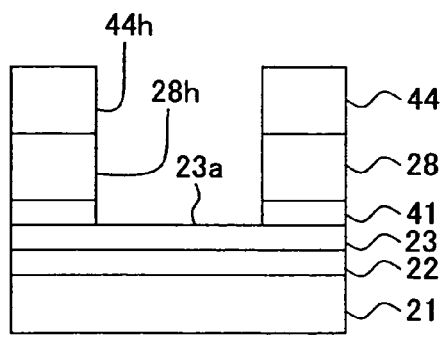

Next, in the process of FIG. 7C, with the resist film 44 serving as a mask, the protection film 41 is removed using etching liquid including hydrogen fluoride so that the surface of the catalyst layer 23 of a Ni film is exposed. Since the Ni film does not dissolve in etching liquid including hydrogen fluoride, there in no decrease in the catalytic function of the catalyst layer 23. The interlayer insulating film 28 dissolves in the etching liquid. However, since the protection film 41 is a thin film, the amount of dissolution during a short soaking period is extremely small, and accordingly, the dissolution of the interlayer insulating film 28 causes no problem. Instead of a Ni film, the catalyst layer 23 may employ a Ni alloy film of a material insoluble in hydrogen fluoride, such as Ni—Fe or Ni—Co.

Next, in the process of FIG. 7D, the carbon nanotubes 26 are formed using thermal CVD. The forming method is equal to that of the first embodiment, and a description thereof is omitted. Preferably, the carbon nanotubes 26 are caused to grow so as to have a length greater than the depth of the contact hole 43h so that the carbon nanotubes 26 protrude from the surface of the interlayer insulating film 28. This provides good electric contact between the carbon nanotubes 26 and the interconnection part 30 formed in the next process since Cu of the interconnection part 30 fills the space between the carbon nanotubes 26.

Next, in the process of FIG. 7E, the barrier metal film 42 of a TiN film of 10 nm in film thickness is formed on the surface of the contact hole 43h and the interlayer insulating film 28 of the structure of FIG. 7D. Then, the interconnection part 30 is formed on the interlayer insulating film 28 via the barrier metal film 42 by plating or sputtering so as to be in contact with or include the carbon nanotubes 26 of the contact 43. Thereby, the semiconductor device 40 of the second embodiment is completed.

According to the manufacturing method of this embodiment, the protection film 41 covers the surface of the catalyst layer 23 until a process immediately before the formation of the carbon nanotubes 26. This prevents a decrease in the catalytic function of the catalyst layer 23a at the time of forming the interlayer insulating film 28 and in the photolithography process.

Next, a description is given of a semiconductor device having a contact where the space between carbon nanotubes is filled with a conductive material according to a variation of the second embodiment.

Figure 8:
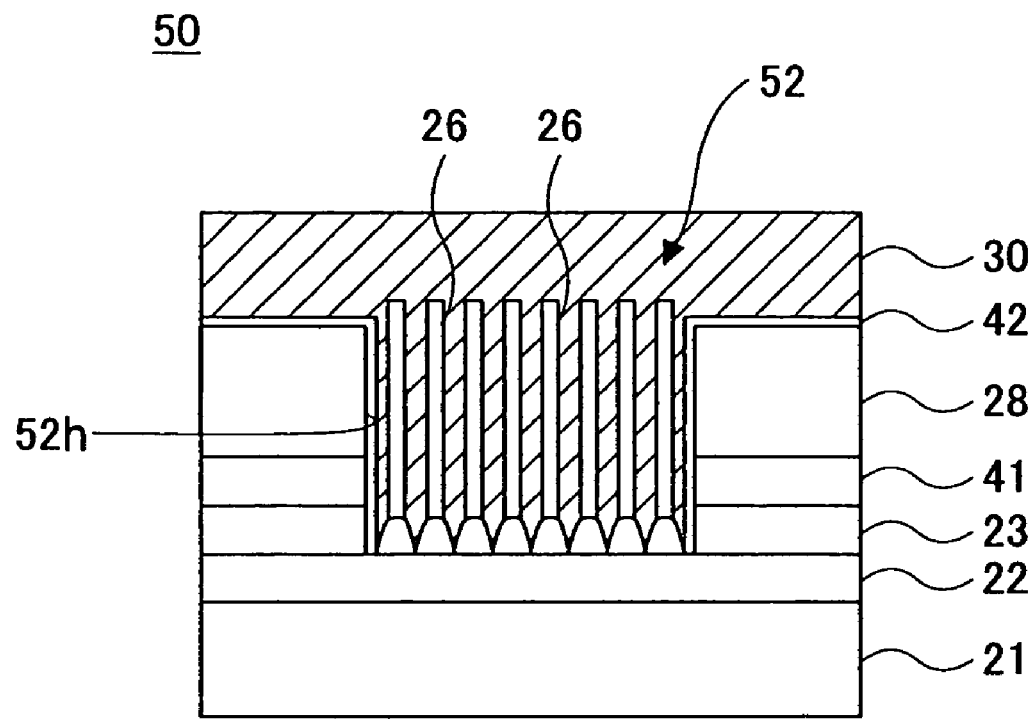
FIG. 8 is a sectional view of part of a semiconductor device according to a variation of the second embodiment of the present invention.

FIG. 8 is a sectional view of part of a semiconductor device 50 according to the variation of the second embodiment. In FIG. 8, the same elements as those described above are referred to by the same numerals, and a description thereof is omitted.

Referring to FIG. 8, the semiconductor device 50 is equal in configuration to the semiconductor device 40 of the second embodiment except that a contact 52 is composed of a bundle of the carbon nanotubes 26 and a conductive material such as Cu filling in the space between the carbon nanotubes 26.

It is preferable that the filling of the space with the conductive material be performed simultaneously with the formation of the interconnection part 30 in the process of FIG. 7E after the formation of the barrier metal film 42. Sputtering, vacuum deposition, or plating is employed in filling the space with the conductive material. Plating is preferable in terms of filling a contact hole 52h with the conductive material. In terms of good filling in a fine hole, electroless plating is preferable to electroplating.

It is not easy to fill the contact hole 52h with only the carbon nanotubes 26 without leaving a space between the carbon nanotubes 26. For instance, it is not easy to perform close packing disposition of the carbon nanotubes 26. Therefore, the composite-material contact 52 having the space between the carbon nanotubes 26 filled with a conductive material such as Cu is formed. As a result, the electric resistance of the contact 52 can be reduced, while the maximum current density allowing the flowing of current without disconnection of the contact 52 can be increased. Further, the thermal conductivity and the mechanical strength of the contact 52 (carbon nanotubes 26) can be improved so that it is possible to prevent removal of the roots and the tips of the carbon nanotubes 26.

The contacts 43 and 52 according to the second embodiment and its variation are applicable to a via between interconnection layers. The growth mode control layer 22 and the catalyst layer 23 in the region other than each of the contacts 43 and 52 may be removed as required.

Third Embodiment

In this embodiment, a semiconductor device including a via composed of carbon nanotubes formed selectively on an interconnection part is disclosed.

Figure 9:
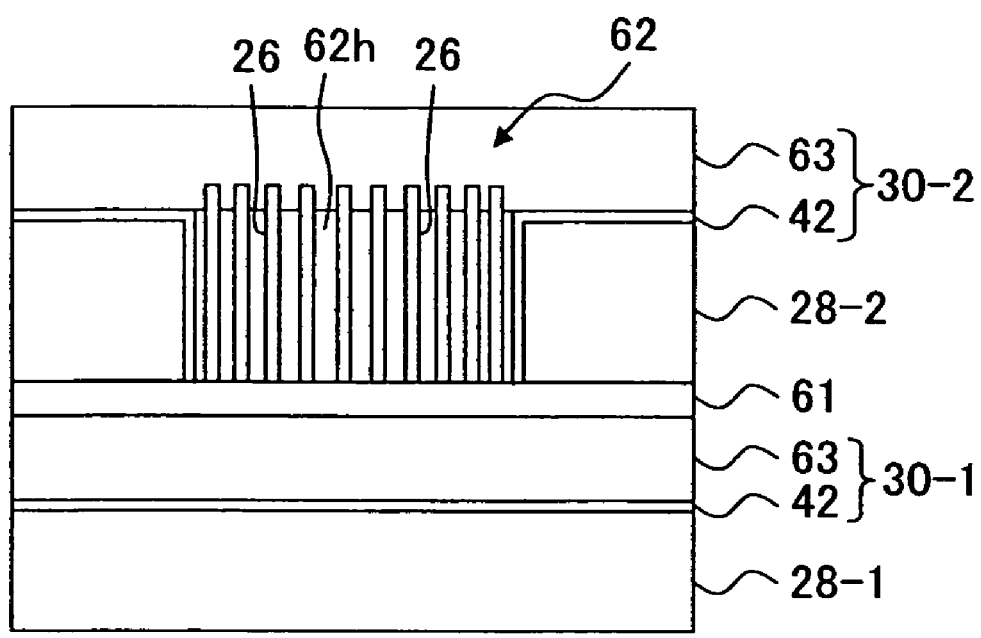
FIG. 9 is a sectional view of part of a semiconductor device according to a third embodiment of the present invention.

FIG. 9 is a sectional view of part of a semiconductor device 60 according to the third embodiment of the present invention. In FIG. 9, the same elements as those described above are referred to by the same numerals, and a description thereof is omitted.

Referring to FIG. 9, the semiconductor device 60 includes a first interlayer insulating film 28-1, a first interconnection part 30-1 formed on the first interlayer insulating film 28-1, a growth mode control layer 61 formed on the first interconnection part 30-1, a via 62 formed selectively on the growth mode control layer 61 so as to be electrically connected to the first interconnection part 30-1, a second interlayer insulating film 28-2 formed in the region other than the region of the via 62, and a second interconnection part 30-2 formed on the via 62 and the surface of the second interlayer insulating film 28-2. The via 62 is composed of the carbon nanotubes 26 formed on the growth mode control layer 61.

Each of the first and second interconnection parts 30-1 and 30-2 is composed of the barrier metal film 42 of a TiN film formed by sputtering and a conductive film 63 of a Cu or Al film formed by plating or sputtering.

The growth mode control layer 61 is formed of any of Mo, V, Nb, and W, which are refractory metals, or a metal oxide of any of the refractory metals and Ti. The metal oxide has an oxygen concentration of 1 at. % or higher, preferably 1-7 at. %. This prevents the Cu or Al film of the first interconnection part 30-1 from being alloyed through interdiffusion with Ni, Fe, or Co of a catalyst layer (not graphically represented) at the time of forming the carbon nanotubes 26. Further, like a metal oxide of Ti, the above-described refractory metals and their alloys have extremely small diffusion coefficients of Cu, Al, and Ni atoms at heating temperatures at the time of forming the carbon nanotubes 26. Therefore, no interdiffusion occurs between the material of the first interconnection layer 30-1 and the material of the catalyst layer. Accordingly, no decline is caused in the catalytic function of the catalyst layer. On the other hand, in the case of using Ti for the growth mode control layer 61, Cu or Al atoms, Ni atoms, and also Ti atoms interdiffuse with one another so as to reduce the catalytic function of the catalyst layer. As a result, the carbon nanotubes 26 are prevented from growing.

In the case of the carbon nanotubes 26 shown in FIG. 9, a metal oxide of any of the above-described refractory metals and Ti (whose oxygen concentration is higher than or equal to 1 at. %) is used for the growth mode control layer 61. That is, the carbon nanotubes 26 shown in FIG. 9 are formed in the tip-growth mode. FIG. 9 shows the state where catalyst particles, fixed to the tips of the carbon nanotubes 26 and promoting their growth, are removed. In the case of employing any of the above-described refractory metals or a metal oxide thereof having an oxygen concentration of less than 1 at. % for the growth mode control layer 61, the carbon nanotubes 26 are formed in the root-growth mode. In this case, a particulate catalyst layer remains between the growth mode control layer 61 and the carbon nanotubes 26. The first and second interlayer insulating films 28-1 and 28-2 are formed of the same material as the interlayer insulating film 28 of the first embodiment.

Next, a description is given of a manufacturing method according to this embodiment.

Figure 10A:
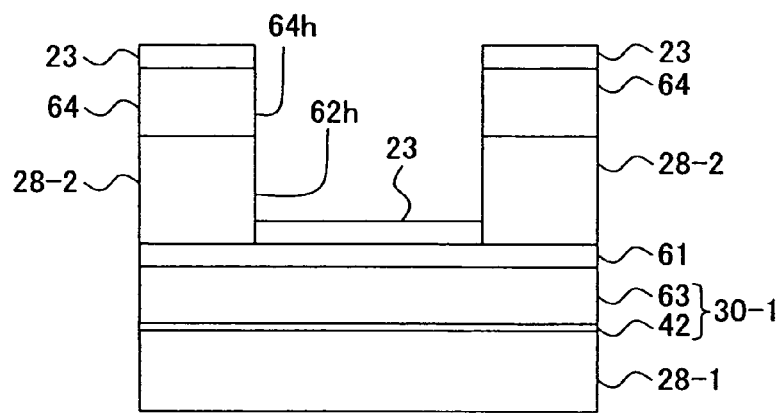
FIGS. 10A through 10C are diagrams showing a semiconductor device manufacturing process according to the third embodiment of the present invention.
Figure 10B:
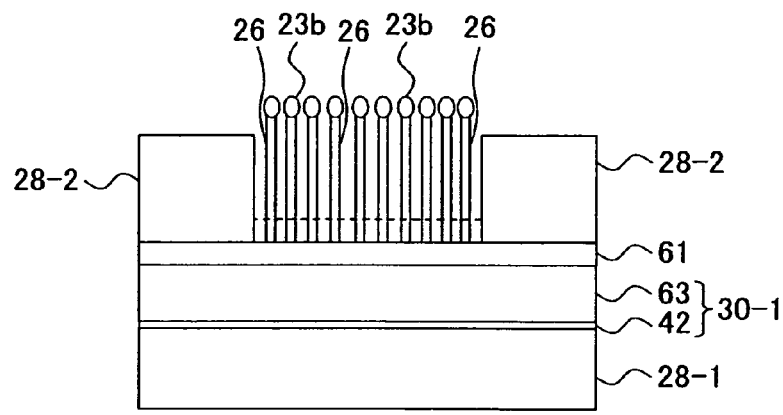
Figure 10C:
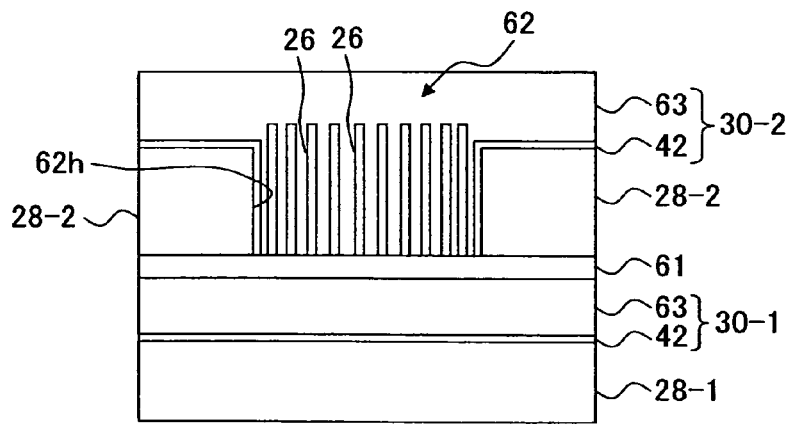

FIGS. 10A through 10C are diagrams showing a semiconductor device manufacturing process according to the third embodiment.

First, in the process of FIG. 10A, the first interlayer insulating film 28-1 of, for instance, a silicon oxide film, is formed by CVD. Then, the barrier metal film 42 of a TiN film of 10 nm in thickness is formed by sputtering, and the conductive film 63 of a Cu film of 300 nm in thickness is formed by plating. The first interconnection part 30-1 formed of the barrier metal film 42 and the conductive film 63 has, for instance, a damascene structure.

Further, in the process of FIG. 10A, the growth mode control layer 61 of a metal oxide of any of the above-described refractory metals and Ti of 5 nm or more in film thickness is formed on the first interconnection part 30-1 by sputtering. It is especially preferable that the growth mode control layer 61 be 15 nm or less in film thickness in terms of resistivity. Next, the second interlayer insulating film 28-2 is formed on the growth mode control layer 61 by CVD. Further, a resist film 64 is formed on the second interlayer insulating film 28-2, and the resist film 64 is patterned so that an opening 64h is formed.

Further, in the process of FIG. 1A, with the resist film 64 serving as a mask, the second interlayer insulating film 28-2 is ground by RIE so that a via hole 62h exposing the surface of the growth mode control layer 61 is formed. Then, the catalyst layer 23 of, for instance, a Ni film of 30 nm in thickness is formed by sputtering.

Next, in the process of FIG. 10B, the catalyst layer 23 on the resist film 64 is lifted off together with the resist film 64. Then, the carbon nanotubes 26 are formed under the same conditions as in the first embodiment by thermal CVD. The carbon nanotubes 26 grow in the tip-growth mode with the catalyst particles 23b being fixed to the tips of the carbon nanotubes 26. Most of the catalyst layer 23 turns into the catalyst particles 23b. Accordingly, the roots of the carbon nanotubes 26 are directly attached onto the growth mode control layer 61.

Next, in the process of FIG. 10C, the catalyst particles 23b of the structure of FIG. 10B is removed by ion milling. If the catalyst particles 23b are a material that does not adversely affect the conductive film 63 of the second interlayer insulating film 30-2 to be formed next, the catalyst particles 23b may or may not be removed.

Further, in the process of FIG. 10C, the barrier metal film 42 of a TiF film of 10 nm in thickness is formed on the second interlayer insulating film 28-2 and the surface of the via hole 62h by sputtering, and the conductive film 63 of a Cu film of 300 nm in thickness is formed by plating. At this point, Cu material may be formed in the space between the carbon nanotubes 26 so as to fill the via hole 62h with the Cu material. Further, the tips of the carbon nanotubes 26 may enter the Cu film 63 of the second interconnection part 30-2. Thereby, the via 62 composed of the carbon nanotubes 26 connecting the first interconnection part 30-1 and the second interconnection part 30-2 is completed.

According to this embodiment, at heating temperatures in the process of forming the carbon nanotubes 26 by thermal CVD, the growth mode control layer 61 prevents interdiffusion between the Cu or Al conductive film 63 of the first interconnection part 30-1 and Ni, Fe, or Co of the catalyst layer 23. Accordingly, it is possible to prevent a decline in the catalytic function of the catalyst layer 23 due to interdiffusion, so that the high-density carbon nanotubes 26 can be formed.

Fourth Embodiment

In this embodiment, an AlGaN/GaN heterojunction HEMT (High Electron Mobility Transistor) having a bundle of carbon nanotubes as a through electrode is described as a semiconductor device.

Figure 11:
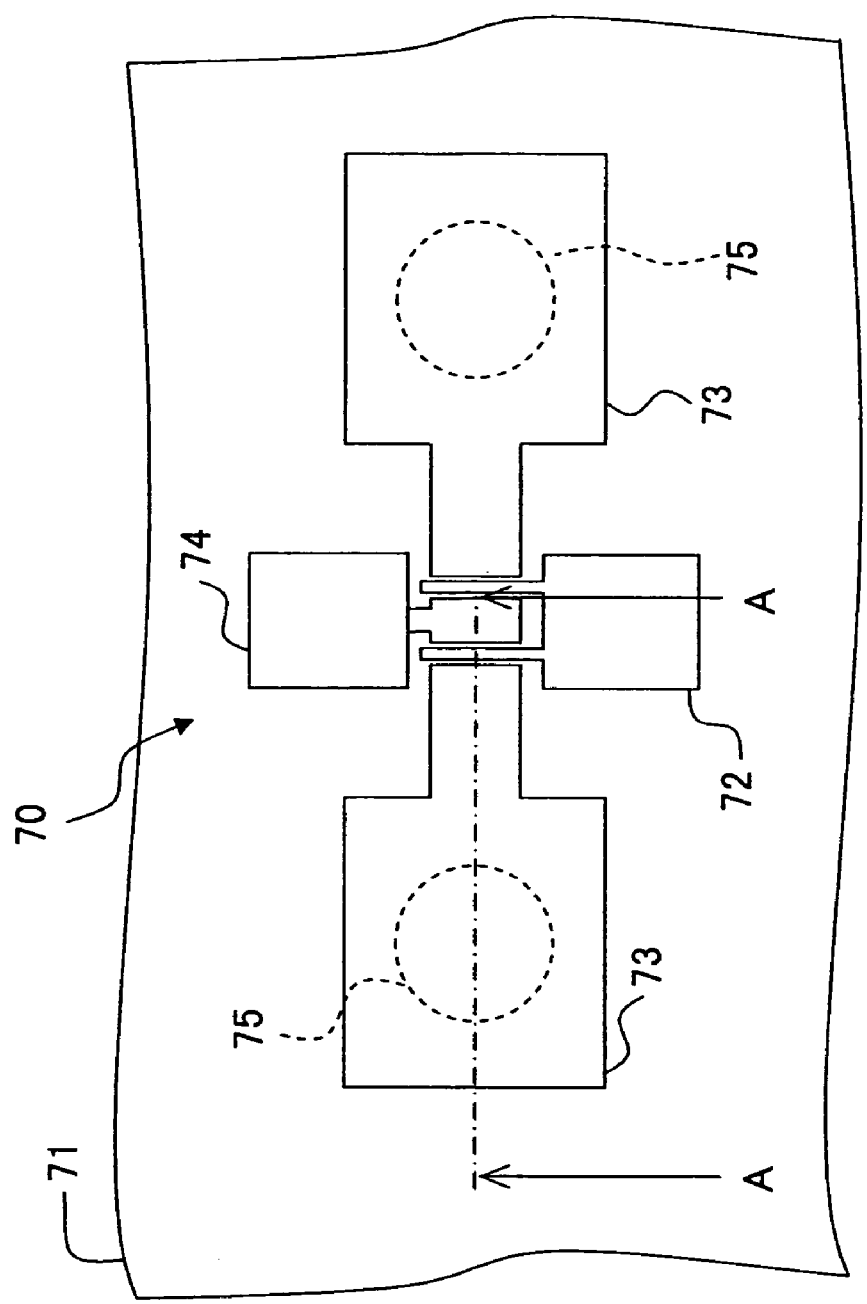
FIG. 11 is a plan view of a semiconductor device according to a fourth embodiment of the present invention.

FIG. 11 is a plan view of a semiconductor device 70 according to the fourth embodiment of the present invention. FIG. 12 is a sectional view of the semiconductor device 70 taken along the line A-A of FIG. 11. Referring to FIGS. 11 and 12, the semiconductor device 70 includes in a single active region 71 two source electrodes 73, a drain electrode 74, and gate electrodes 72 that are formed between the drain electrode 74 and the source electrodes 73 so as to be electrically connected to each other.

In the semiconductor device 70, an i-type GaN film 78, which is a channel layer, an i-type AlGaN film 79, which is a spacer layer, and an n-type AlGaN film 80, which is an electron supply layer, are stacked in the order described on an upper-side surface 76a of a SiC substrate 76, and the source electrodes 73, the gate electrodes 72, and the drain electrode 74 are disposed on the surface of the n-type AlGaN film 80. The flow of two-dimensional electron gas formed at the interface between the GaN film 78 and the AlGaN film 79 is controlled by electric fields from the gate electrodes 72, so that the current between each source electrode 73 and the drain electrode 74 is controlled.

A through electrode 75 penetrating through the SiC substrate 76 is formed under each source electrode 73 so as to electrically and thermally connect the corresponding source electrode 73 and a ground electrode 83 provided on a lower-side surface 76b of the SiC substrate 76. The through electrode 75 is composed of a carbon nanotube structure 85 formed of a bundle of carbon nanotubes.

The SiC substrate 76 described in this embodiment may be replaced by an insulating substrate of InP, GaAs, or sapphire.

Next, a description is given of a semiconductor device manufacturing method according to this embodiment.

FIGS. 13A through 13F are diagrams showing a semiconductor device manufacturing process according to this embodiment. In FIGS. 13A through 13F, only one of the source electrodes 73 and only one of the gate electrodes 72 are shown with their corresponding elements for convenience of description.

Figure 13A:
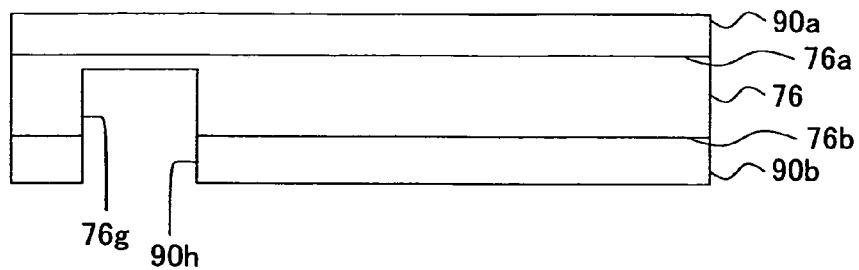
FIGS. 13A through 13F are diagrams showing a semiconductor device manufacturing process according to the fourth embodiment of the present invention.

First, in the process of FIG. 13A, resist films 90a and 90b are formed on the surfaces 76a and 76b, respectively, of the SiC substrate 76 of approximately 100 μm in thickness. An opening 90h is formed at the position of a groove to be formed in the next process in the resist film 90b, which is on the side of the surface 76b on which the ground electrode 83 is to be formed in a downstream process.

Further, in the process of FIG. 13A, with the resist film 90b serving as a mask, the SiC substrate 76 is ground by plasma etching using a $ClF_3$ etching gas so that a groove 76g is formed. The groove 76g has a cylindrical shape. However, the groove 76g is not limited in shape, and may be shaped like a rectangular parallelepiped. The amount of grinding is controlled to less than the thickness of the SiC substrate 76, so that a thickness of, for instance, several hundred nanometers is left in the SiC substrate 76 so as to prevent the groove 76g from penetrating through the SiC substrate 76. The amount of grinding is controlled by, for instance, etching speed and etching time. The groove 76g may be formed by wet etching using KOH or NaOH.

Figure 13B:
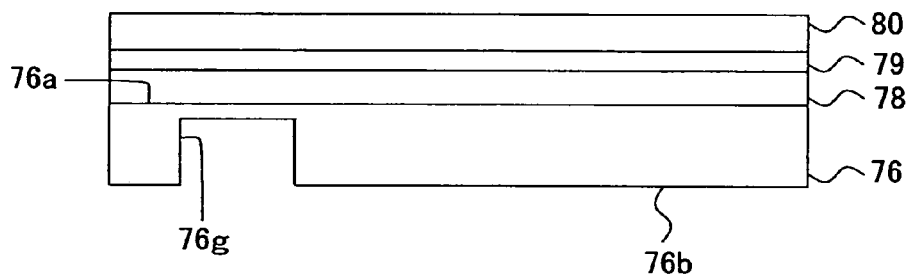

Next, in the process of FIG. 13B, the resist films 90a and 90b are removed from the structure of FIG. 13A, and the i-type GaN film 78 of 2 μm in thickness including a buffer layer is formed by metalorganic CVD (MOCVD) on the surface 76a of the SiC substrate 76 on the side opposite to the surface 76b on which the groove 76g is formed. The outermost surface part of the i-type GaN film 78, approximately 20 nm in thickness, functions as a channel layer. In this MOCVD, a process gas employs TMGa (trimethylgallium) as a Ga source and $NH_3$ as a N source. Hydrogen gas or a gas mixture of hydrogen and nitrogen is employed as a carrier gas. A pressure is set to 20 torr, and a substrate temperature is set to 1000° C.

Further, in the process of FIG. 13B, the i-type AlGaN film 79 of approximately 5 nm in thickness is formed on the i-type GaN film 78 as a spacer layer by MOCVD. A process gas further includes TMAl (trimethylaluminum) as an Al source in addition to TMGa and $NH_3$ described above. A pressure is set to 20 torr, and a substrate temperature is set to 1000° C.

Further, in the process of FIG. 13B, the n-type AlGaN film 80 of approximately 50 nm in thickness is formed on the i-type AlGaN film 79 as an electron supply layer by MOCVD. A gas to which Si is added as an n-type impurity source in addition to TMGa, $NH_3$, and TMAl described above is employed as a process gas. A pressure is set to 20 torr, and a substrate temperature is set to 1000° C. The semiconductor films 78 through 80 may be formed by molecular beam epitaxy (MBE) instead of MOCVD.

Figure 13C:
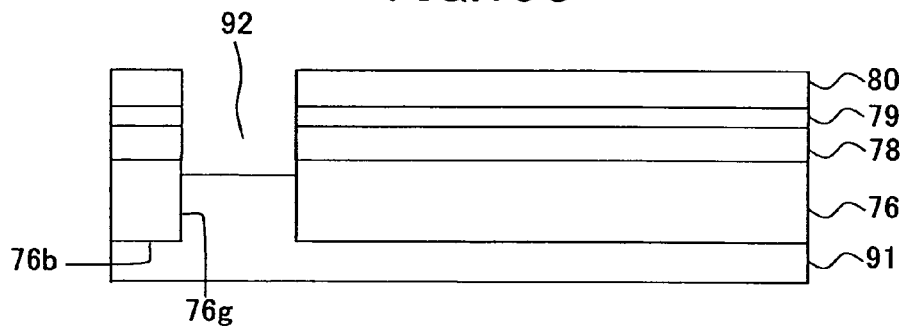

Next, in the process of FIG. 13C, a resist film 91 is formed so as to fill in the groove 76g formed in the SiC substrate 76 and cover the surface 76b of the SiC substrate 76 of the structure of FIG. 13B. Then, a resist film (not graphically represented) is formed on the n-type AlGaN film 80. The resist film is patterned so that a resist pattern having an opening is formed. Employing this resist pattern as a mask, an opening 92, penetrating through the n-type AlGaN film 80, the i-type AlGaN film 79, the i-type GaN film 78, and the SiC substrate 76 so as to expose the surface of the resist film 91 and connect with the groove 76g, is formed by plasma etching using an etching gas such as $BCl_3$. Thereafter, the resist pattern is removed.

Figure 13D:
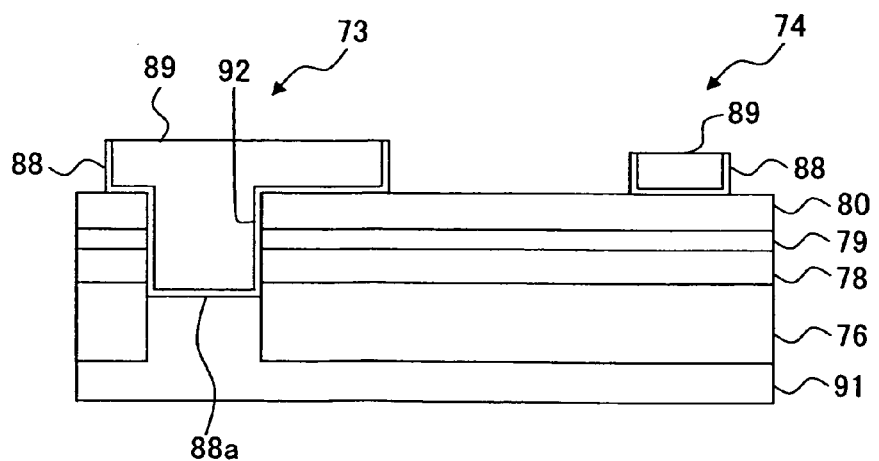

Next, in the process of FIG. 13D, a resist film (not graphically represented) is formed on the n-type AlGaN film 80. The resist film is patterned so that a resist pattern having openings in the shape of the source electrode 73 and the drain electrode 74 is formed. Then, employing this resist pattern as a mask, a Ti film 88 of 10 nm in thickness and a Au film 89 of 300 nm in thickness are formed by vapor deposition. The opening 92 is filled with the Ti film 88 and the Au film 89 up to the surface of the resist film 91. Thus, the source electrode 73 and the drain electrode 74 are formed on the n-type AlGaN film 80. Thereafter, the resist pattern is removed.

Figure 13E:
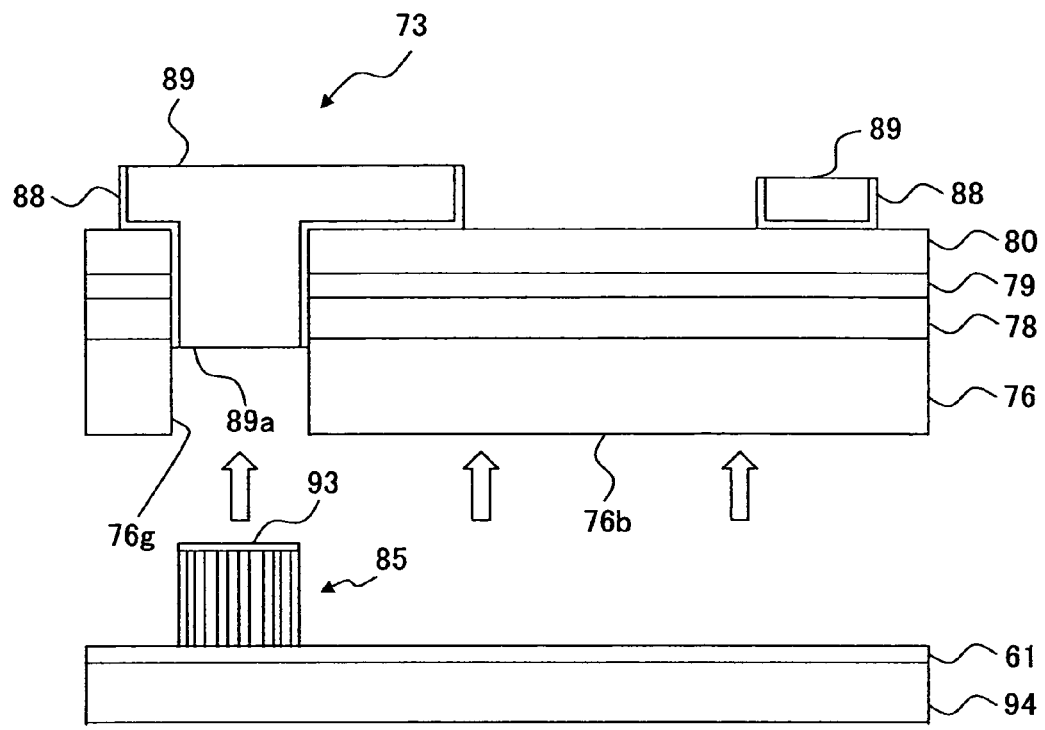

Next, in the process of FIG. 13E, the resist film 91 of the structure of FIG. 13D is removed. Then, a process substrate 94 on which the carbon nanotube structure 85 having a shape corresponding to the groove 76g is formed at a position corresponding to the groove 76g is prepared. The carbon nanotube structure 85 is formed under the same thermal CVD process conditions as in the third embodiment with the growth mode control layer 61 formed on the process substrate 94 employing a metal oxide of any of the above-described refractory metals (Mo, V, Nb, and W) and Ti having an oxygen concentration of 1 at. % or higher. The carbon nanotubes of the carbon nanotube structure 85 are grown in the tip-growth mode, which corresponds to the material composition of the growth mode control layer 61. It is preferable that the height of the carbon nanotube structure 85, that is, the length of the carbon nanotubes, be greater than the depth of the groove 76g. According to this configuration, when the carbon nanotube structure 85 is attached, the carbon nanotube structure 85 protrudes from the surface 76b of the SiC substrate 76, which ensures contact with the ground electrode 83 to be formed in the next process.

Catalyst particles (not graphically represented) at the tips of the carbon nanotubes are removed by ion milling, and a Au film 93 of, for instance, 200 nm in thickness is formed on the surface of the carbon nanotube structure 85. The Au film 93 is a metal film to be adhered by heating to a Au film surface or a lower surface 89a of the source electrode 73. The Au film 93 may be replaced by a Sn film or a Au—Sn alloy film.

Further, in the process of FIG. 13E, a Ti film 88a formed on the lower surface 89a of the source electrode 73 of the structure of FIG. 13D is removed by ion milling so that the Au film surface 89a is exposed. Then, the carbon nanotube structure 85 on the process substrate 94 is aligned with the groove 76g of the SiC substrate 76. The Au film surface 89a of the source electrode 73 and the Au film 93 of the carbon nanotube structure 85 are brought into contact with each other to be adhered to each other by heating under the conditions of a temperature of 300° C. and a heating period of 60 seconds. Specifically, in the case of adhering Au films to each other, heating is performed at a heating temperature of 200-300° C. for a heating period of 30-90 seconds. Next, after cooling, the carbon nanotube structure 85 is removed at its root. Thus, the carbon nanotube structure 85 adheres to the lower surface 89a of the source electrode 73 so that the through electrode 75 filling in the groove 76g is formed as shown in FIG. 13F.

Figure 13F:
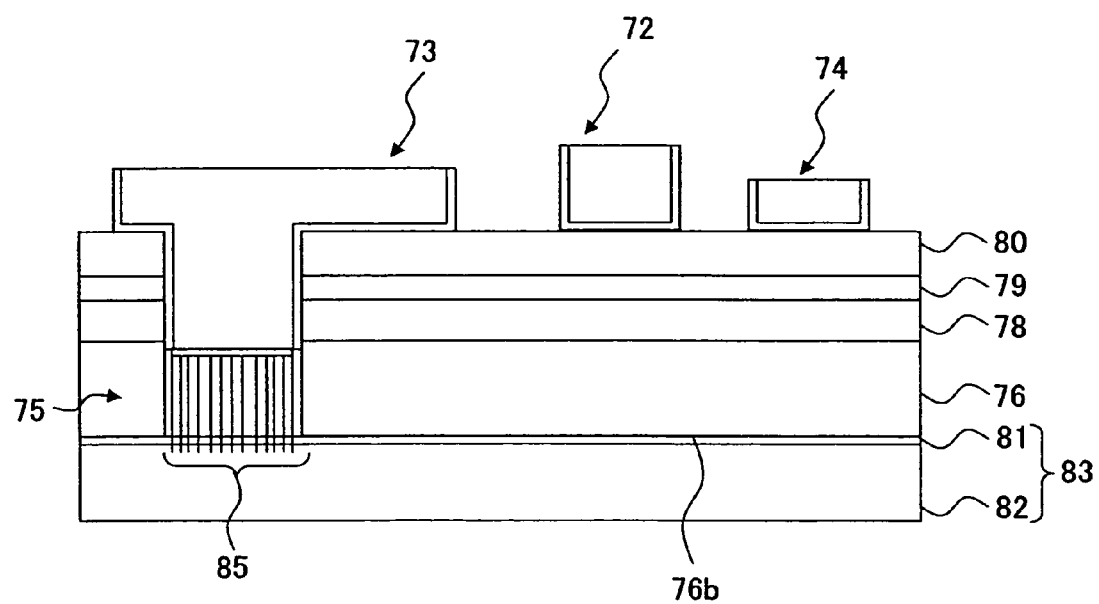

Next, in the process of FIG. 13F, the ground electrode 83 composed of a Ti film 81 of 10 nm in thickness and a Au film 82 of 300 nm in thickness is formed on the surface 76b of the SiC substrate 76 by vacuum deposition. Then, a resist film (not graphically represented) is formed on the n-type AlGaN film 80. The resist film is patterned so that a resist pattern having an opening in the shape of the gate electrode 72 is formed. Then, using the resist pattern as a mask, the gate electrode 72 composed of the Ti film 88 of 10 nm in thickness and the Au film 89 of 200 nm in thickness is formed by vapor deposition. Thereafter, the resist pattern is removed. Thereby, a semiconductor device having the through electrodes 75 each connecting the corresponding source electrode 73 and the ground electrode 83 by the corresponding carbon nanotube structure 85, that is, the semiconductor device 70 of the fourth embodiment, is formed.

According to this embodiment, the carbon nanotube structure 85 is formed in a process separate from that of the semiconductor device 70. Accordingly, the carbon nanotube structure 85 can be provided to the semiconductor device 70 at processing temperatures lower than heating temperatures according to thermal CVD. Therefore, thermal damage to the semiconductor device 70 can be greatly reduced.

According to this embodiment, the carbon nanotube structure 85 is formed by the tip-growth mode. Therefore, the carbon nanotube structure 85 has a substantially plane surface. As a result, it is easy to adhere the carbon nanotube structure 85 to the lower surface 89*a* of the source electrode 73, and it is easy to remove the carbon nanotube structure 85 from the process substrate 94.

The method of introducing the carbon nanotube structure 85 according to this embodiment is applicable not only to the through electrode 75 but also to vertical interconnects and interconnects in an interconnection layer, such as vias and plugs.

In particular, according to the manufacturing method of this embodiment, even when the semiconductor device 70 is, for instance, a thermally vulnerable FeRAM, the carbon nanotube structure 85 can be introduced without thermally damaging a ferroelectric capacitor film.

Further, the carbon nanotube structure 85 is preferable as an electron emission element of a field emission display. A Au film is preformed selectively at a predetermined position where an electron emission element is to be disposed, and the carbon nanotube structure 85, which has the Au film 93 formed on its surface and is formed on the surface of the growth mode control layer 61 formed in the form of an unpatterned film on the process substrate 94, is adhered to the Au film by heating and removed from the process substrate 94. As a result, an electron emission element whose tip part is the roots of the carbon nanotubes removed from the process substrate 94 can be formed at the predetermined position. A bundle of carbon nanotubes formed by the tip-growth mode, where the carbon nanotubes are substantially uniform in length as described above, forms a uniform discharge state easily.

Fifth Embodiment

In this embodiment, a semiconductor device having an interconnection part composed of carbon nanotubes and a conductive material filling in the space between the carbon nanotubes is disclosed.

Figure 14:
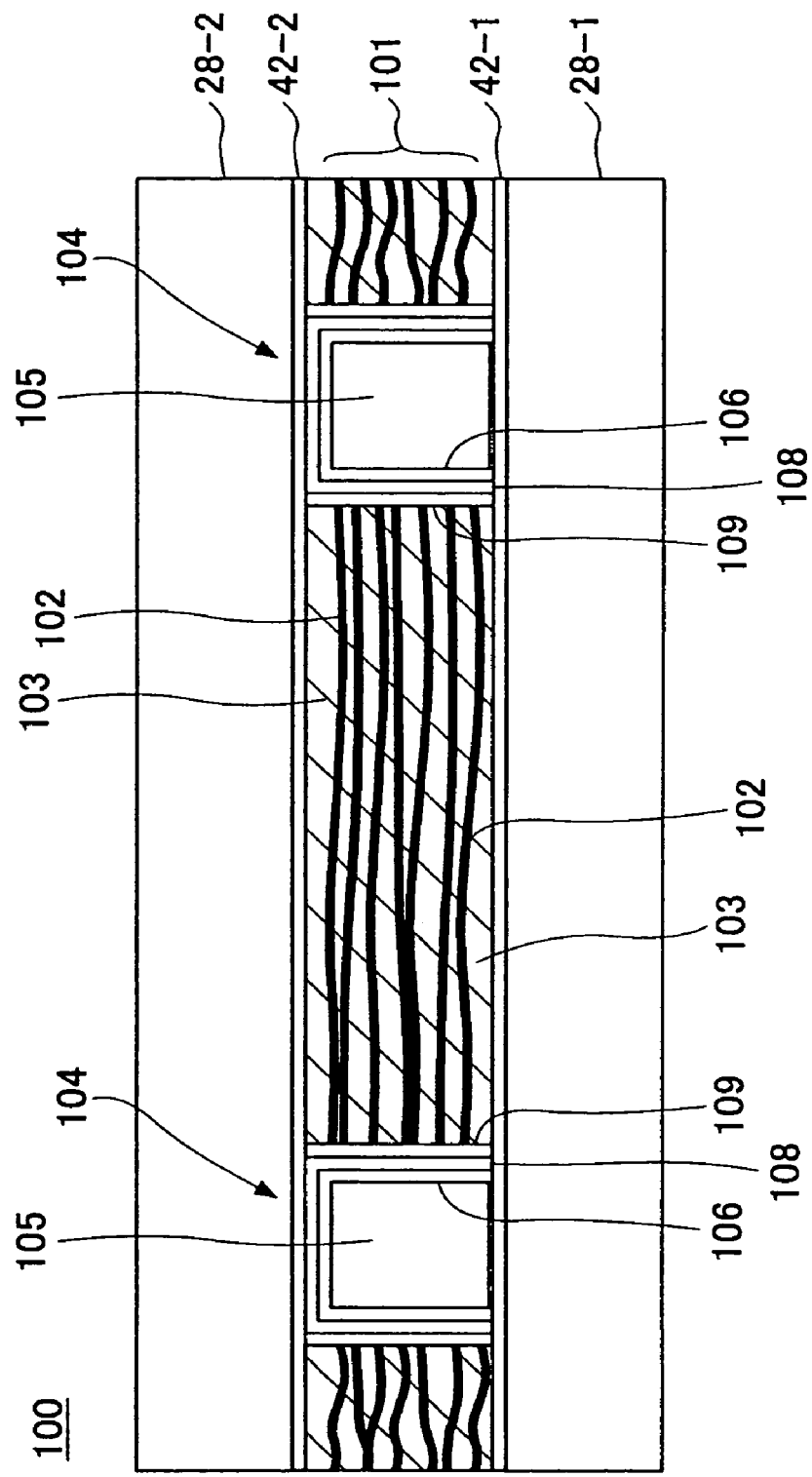
FIG. 14 is a sectional view of part of a semiconductor device according to a fifth embodiment of the present invention.

FIG. 14 is a sectional view of part of a semiconductor device 100 according to the fifth embodiment of the present invention. In FIG. 14, the same elements as those described above are referred to by the same numerals, and a description thereof is omitted.

Referring to FIG. 14, the semiconductor device 100 includes the first interlayer insulating film 28-1, an interconnection part 101 formed on the first interlayer insulating film 28-1, and the second interlayer insulating film 28-2 formed on the interconnection part 101. The interconnection part 101 is composed of multiple carbon nanotubes 102 grown in an in-layer direction and a conductive material 103 filling in the space between the carbon nanotubes 102 and the interconnection part 101. Conductive projections 105 of, for instance, Cu and projecting structures 104 are also provided in the interconnection part 101. Each projecting structure 104 is composed of an adhesion film 106 of Ta covering the conductive projection 105, a growth mode control layer 108 stacked on the adhesion film 106, and a particulate catalyst layer 109 stacked on the growth mode control layer 108.

The interconnection part 101 is characterized mainly by the carbon nanotubes 102 extending in an in-layer direction and the conductive material 103 filling in the space between the carbon nanotubes 102. Filling the space between the carbon nanotubes 102 with the conductive material 103 results in a further reduction in interconnect resistance and a further increase in the maximum density of current that the carbon nanotubes 102 can cause to flow.

Cu or Al is employable as the conductive material 103 of the interconnection part 101. Further, any of Au, Pt, Ag, and Ti, or an alloy including any of such metals is also employable as the conductive material 103 of the interconnection part 101. This results in a further reduction in electric resistance. In terms of adhesion to the carbon nanotubes 102, Ti is preferable.

The same growth mode control layer and particulate catalyst layer as in the first through fourth embodiments are stacked in layers to define the surface of each projecting structure 104. Accordingly, the growth mode of the carbon nanotubes 102 can be controlled. In FIG. 14, the particulate catalyst layer 109 is shown as a layer for convenience of description.

Next, a description is given of a semiconductor device manufacturing method according to this embodiment.

Figure 15A:
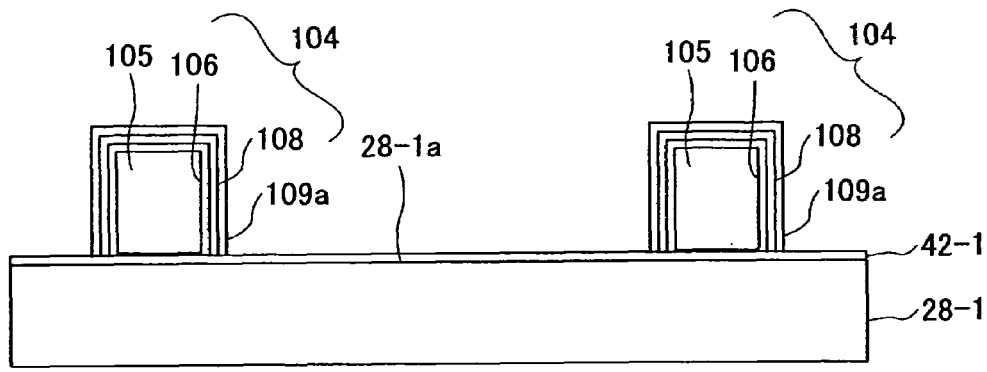
FIGS. 15A through 15C are diagrams showing a semiconductor device manufacturing process according to the fifth embodiment of the present invention.
Figure 15B:
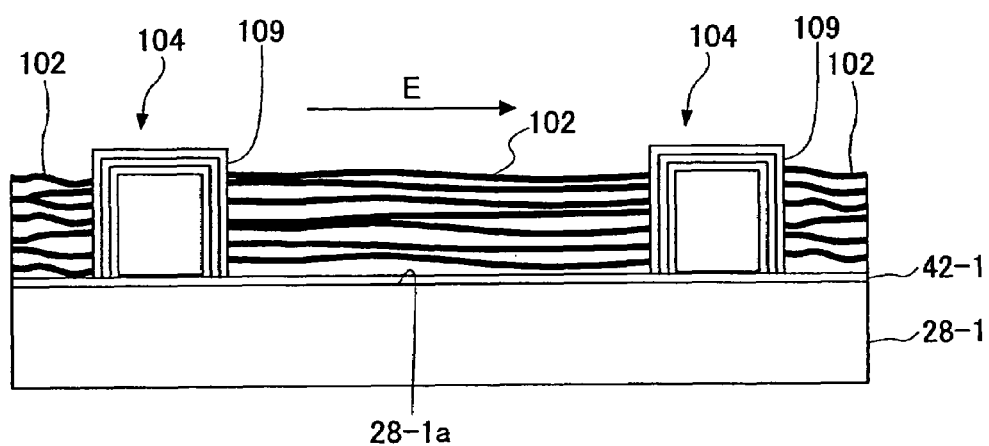
Figure 15C:
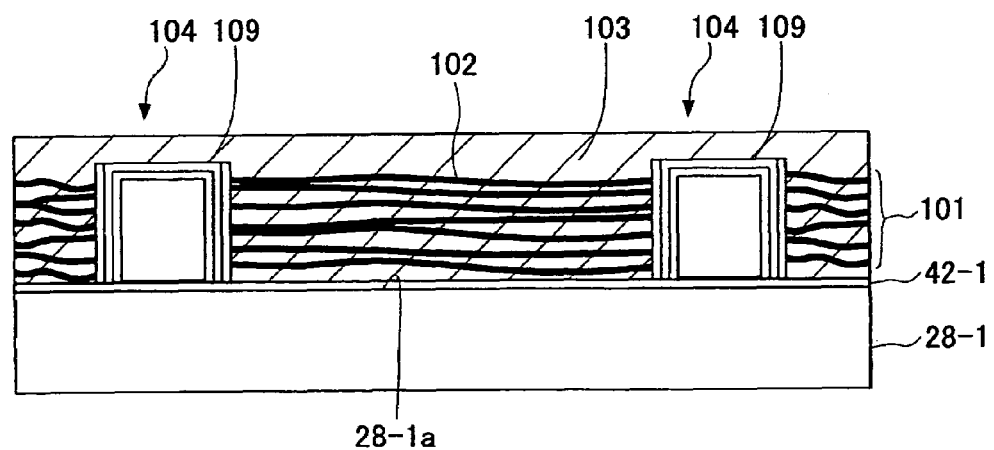

FIGS. 15A through 15C are diagrams showing a semiconductor device manufacturing process according to the fifth embodiment.

First, in the process of FIG. 15A, the first interlayer insulating film 28-1 formed of a silicon oxide film is patterned so that an inter connection groove 28-1*a* to define the interconnection part 101 in a downstream process is formed. Next, a barrier metal film 42-1 is formed on the surface of the interconnection groove 28-1*a*. The conductive projections 105 of, for instance, Cu are formed at intervals of approximately 100 μm along the interconnection groove 28-1*a* on the barrier metal film 42-1. Although not graphically represented, the conductive projections 105 are formed as follows. A resist pattern is patterned so that openings in the shape of the conductive projections 105 are formed. The openings are filled with Cu by plating. Then, the resist film is removed.

Further, in the process of FIG. 15A, the adhesion film 106 of Ta (5 nm in film thickness) covering the conductive projection 105, the growth mode control layer 108 of a Ti film (2.5 nm in film thickness), and a catalyst layer 109*a* of a Co film (2.5 nm in film thickness) are formed by sputtering. At this point, the regions other than the conductive projections 105 are covered with a resist film, and the stacked layers 106, 108, and 109*a* are removed by lift-off.

Next, in the process of FIG. 15B, the carbon nanotubes 102 are grown by thermal CVD in substantially the same process as in the first embodiment. At this point, an electric field is applied along the multiple projecting structures 104 (in a direction indicated by arrow E in FIG. 15B). By applying the electric field, the carbon nanotubes 102 grow with good linearity in the direction of the application of the electric field, so that the density of the carbon nanotubes 102 in the interconnection groove 28-1*a* can be increased. As a result of heating by thermal CVD, the catalyst layer 109a turns into the particulate catalyst layer 109.

Next, in the process of FIG. 15C, the conductive material 103 of a Cu film is provided on the surface of the interconnection groove 28-1a so as to fill in the space between the carbon nanotubes 102 by well-known electroless plating. Electroless plating may be replaced by CVD.

Next, although not graphically represented, the surface of the structure of FIG. 15C is flattened by CMP until the particulate catalyst layer 109 is exposed or ground. Then, a barrier metal film 42-2 (FIG. 14) is formed by sputtering so that the interconnection part 101 is formed. Then, the second interlayer insulating film 28-2 is formed by sputtering or CVD. Thereby, the semiconductor device 100 of this embodiment shown in FIG. 14 is formed.

According to the manufacturing method of this embodiment, the projecting structures 104, each formed of the adhesion film 106, the growth mode control layer 108, and the particulate catalyst layer 109 that are successively stacked, are formed in the interconnection groove 28-1a, and an electric field is applied along the arranged multiple projecting structures 104. Thereby, the carbon nanotubes 102 can be formed easily along the interconnection direction in the interconnection groove 28-1a.

The present invention is not limited to the specifically disclosed embodiments, and variations and modifications may be made without departing from the scope of the present invention.

For instance, the interconnection part 101 of the fifth embodiment may be formed in combination with any of the contacts 29, 43, and 52 and the via 62 of the first through third embodiments. Further, any of the interconnection part 101, the contacts 29, 43, and 52, and the via 62 may be combined with the semiconductor device 70 of the fourth embodiment.

What is claimed is:

1. A semiconductor device including a vertical interconnection part formed of a plurality of carbon nanotubes, comprising:
    a growth mode control layer formed of one of a metal and a metal oxide thereof, the metal being selected from a group of Ti, Mo, V, Nb, and W, the metal oxide having an oxygen concentration of less than 1 at. %;
    a catalyst layer formed on the growth mode control layer;
    the plurality of carbon nanotubes formed in a region of the vertical interconnection part on the catalyst layer, the plurality of carbon nanotubes extending in a vertical direction; and
    an alloy layer of the growth mode control layer and the catalyst layer, the alloy layer being formed in a region other than the region of the vertical interconnection part.

2. A semiconductor device including a vertical interconnection part formed of a plurality of carbon nanotubes, comprising:
    a growth mode control layer formed of one of a metal and a metal oxide thereof, the metal being selected from a group of Ti, Mo, V, Nb, and W;
    a catalyst layer of Ni formed on the growth mode control layer;
    a protection film formed in a region other than a region of the vertical interconnection part on the catalyst layer; and
    the plurality of carbon nanotubes formed in the region of the vertical interconnection part, the plurality of carbon nanotubes extending in a vertical direction.

3. The semiconductor device as claimed in claim 2, wherein the metal oxide of the growth mode control layer has an oxygen concentration of less than 1 at. %.

4. A semiconductor device including a first vertical interconnection part formed of one of Cu and Al and a second vertical interconnection part that is in contact with a surface of the first vertical interconnection part, wherein:
    the second vertical interconnection part comprises:
    a growth mode control layer formed on the first vertical interconnection part, the growth mode control layer being formed of one of a metal selected from a group of Mo, V, Nb, and W, a metal oxide of the metal, and a metal oxide of Ti;
    a catalyst layer formed on the growth mode control layer; and
    a plurality of carbon nanotubes formed on the catalyst layer.

* * * * *